United States Patent
Nosaka

(10) Patent No.: US 11,728,787 B2
(45) Date of Patent: Aug. 15, 2023

(54) FILTER DEVICE, RADIO-FREQUENCY FRONT-END CIRCUIT, AND COMMUNICATION APPARATUS

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 132 days.

(21) Appl. No.: 16/984,421

(22) Filed: Aug. 4, 2020

(65) Prior Publication Data

US 2020/0366273 A1 Nov. 19, 2020

Related U.S. Application Data

(63) Continuation of application No. PCT/JP2018/041282, filed on Nov. 7, 2018.

(30) Foreign Application Priority Data

Feb. 5, 2018 (JP) ................................ 2018-018283

(51) Int. Cl.
*H03H 9/64* (2006.01)
*H03H 9/70* (2006.01)
(Continued)

(52) U.S. Cl.
CPC ............ *H03H 9/6476* (2013.01); *H03H 9/25* (2013.01); *H03H 9/703* (2013.01); *H03H 9/725* (2013.01); *H04B 1/40* (2013.01)

(58) Field of Classification Search
CPC ....... H03H 9/54; H03H 9/64; H03H 9/70–725
See application file for complete search history.

(56) References Cited

U.S. PATENT DOCUMENTS

| 6,115,592 A * | 9/2000 | Ueda .................... H03H 9/6476 455/303 |
| 6,242,843 B1 * | 6/2001 | Pohjonen ................ H01P 1/127 310/313 R |

(Continued)

FOREIGN PATENT DOCUMENTS

| CN | 103959647 A | 7/2014 |
| JP | 08-018392 A | 1/1996 |

(Continued)

OTHER PUBLICATIONS

International Search Report and Written Opinion dated Jan. 22, 2019 for PCT/JP2018/041282 filed on Nov. 7, 2018, 8 pages including English Translation of the International Search Report.

(Continued)

*Primary Examiner* — Hafizur Rahman
*Assistant Examiner* — Alan Wong
(74) *Attorney, Agent, or Firm* — Xsensus LLP

(57) ABSTRACT

A filter device includes a first filter and a second filter. The first filter and the second filter are disposed in parallel between a first terminal and a second terminal. A first passband of the filter device includes at least part of a second passband of the first filter. The first passband includes at least part of a third passband of the second filter. The second passband is narrower than the first passband. The third passband is narrower than the first passband. The third passband has a center frequency higher than a center frequency of the second passband. The first filter includes multiple elastic wave resonators and a first capacitive element. The first capacitive element is connected in parallel with the first elastic wave resonator.

17 Claims, 20 Drawing Sheets

(51) Int. Cl.
  *H03H 9/72*   (2006.01)
  *H03H 9/25*   (2006.01)
  *H04B 1/40*   (2015.01)

(56) References Cited

U.S. PATENT DOCUMENTS

| | | | | |
|---|---|---|---|---|
| 6,724,278 | B1* | 4/2004 | Smith | H04B 1/52 333/133 |
| 8,742,870 | B2* | 6/2014 | Franzon | H03H 7/0115 333/202 |
| 9,041,484 | B2* | 5/2015 | Burgener | H03H 9/542 333/133 |
| 9,837,983 | B2* | 12/2017 | Xu | H03H 9/6423 |
| 10,044,340 | B2* | 8/2018 | Fujiwara | H03H 9/70 |
| 10,181,839 | B2* | 1/2019 | Tomita | H03H 7/40 |
| 10,491,191 | B2* | 11/2019 | Sekine | H03H 9/542 |
| 10,536,134 | B2* | 1/2020 | Ito | H03H 9/542 |
| 10,886,897 | B2* | 1/2021 | Yasuda | H03H 9/6483 |
| 11,283,428 | B2* | 3/2022 | Nosaka | H03H 9/68 |
| 2011/0169589 | A1 | 7/2011 | Franzon et al. | |
| 2012/0313731 | A1 | 12/2012 | Burgener et al. | |
| 2014/0218129 | A1 | 8/2014 | Fujiwara et al. | |
| 2017/0331458 | A1* | 11/2017 | Tomita | H03H 9/0009 |

FOREIGN PATENT DOCUMENTS

| | | |
|---|---|---|
| JP | 2001-326557 A | 11/2001 |
| JP | 2004-343168 A | 12/2004 |
| JP | 2008-160629 A | 7/2008 |
| JP | 2012-519447 A | 8/2012 |
| JP | 2013-197772 A | 9/2013 |

OTHER PUBLICATIONS

Office Action dated Jan. 20, 2023, in corresponding Chinese patent Application No. 201880088566.0, 12 pages.

* cited by examiner (a)

(b)

(a)

(b)

(c)

4A

FILTER DEVICE, RADIO-FREQUENCY FRONT-END CIRCUIT, AND COMMUNICATION APPARATUS

CROSS REFERENCE TO RELATED APPLICATIONS

This is a continuation application of PCT International Application No. PCT/JP2018/041282 filed on Nov. 7, 2018, designating the United States of America, which is based on and claims priority of Japanese Patent Application No. 2018-018283 filed on Feb. 5, 2018. The entire contents of the above-identified applications, including the specifications, drawings and claims are incorporated herein by reference in their entirety.

TECHNICAL FIELD

The present disclosure relates to a filter (or filter device), a radio-frequency (RF) front-end circuit, and a communication apparatus.

BACKGROUND ART

A conventionally known filter has a parallel connection of two filters of different passbands for a wider passband. For example, in a radio receiver circuit disclosed in Japanese Patent Laying-Open No. 2008-160629 (PTL 1), two bandpass filters of different passbands are connected in parallel for a wider passband.

CITATION LIST

Patent Literature

PTL 1: Japanese Patent Laying-Open No. 2008-160629

SUMMARY

Technical Problems

Typically, a passband of a filter is formed through parallel connection of a first filter and a second filter, as in the radio receiver circuit disclosed in PTL 1. The center frequency of the passband of the second filter is higher than the center frequency of the passband of the first filter. In other words, of the passband of the filter device, a frequency band (on the low band part of the passband, or "low band sided side") lower than the center frequency of the filter device is mainly formed by the first filter (low band sided filter), and a frequency band (on the high band part of the passband, or "high band sided side") higher than the center frequency of the filter device is mainly formed by the second filter (high band sided filter).

As recognized by the present inventor, when the first filter includes an elastic wave filter, the frequency range of the passband of the second filter would be higher than the antiresonance frequency of the elastic wave resonator which is included in the first filter. In such a case, this elastic wave resonator has a capacitive impedance at frequencies within the passband of the second filter, and so this elastic wave resonator functions as a capacitor.

Also recognized by the present inventor, at a frequency band higher than the antiresonance frequency of the elastic wave resonator, however, a loss (bulk wave loss) occurs due to a bulk wave generated in the piezoelectric substrate of the elastic wave resonator. Consequently, Q characteristics of the elastic wave resonator functioning as the capacitor deteriorate. This results in a deteriorated insertion loss of the filter device at the highest frequency (high band edge) of the passband of the filter device.

The present disclosure has been made to solve this another other problems and aims to reduce an insertion loss at a high band edge of a passband of a filter device.

Solutions

In one non-limiting aspect of the present disclosure, a filter device according to an embodiment of the present disclosure has a passband. The filter device includes a first filter and a second filter connected in parallel with each other between a first terminal and a second terminal. The passband of the filter device includes at least part of a first passband of the first filter and at least part of a second passband of the second filter, the first passband and the second passband being narrower than the passband of the filter device. The second passband has a center frequency higher than a center frequency of the first passband. The first filter includes a plurality of elastic wave resonators and a first capacitive element. The first capacitive element is connected in parallel with a first elastic wave resonator included in the plurality of elastic wave resonators.

Advantageous Effects

In the filter device according to an embodiment of the present disclosure, a capacitor connected in parallel with the elastic wave resonator of the low band sided filter can reduce an insertion loss at the high band edge of the passband of the filter device.

DESCRIPTION OF EMBODIMENTS

Figure 1:
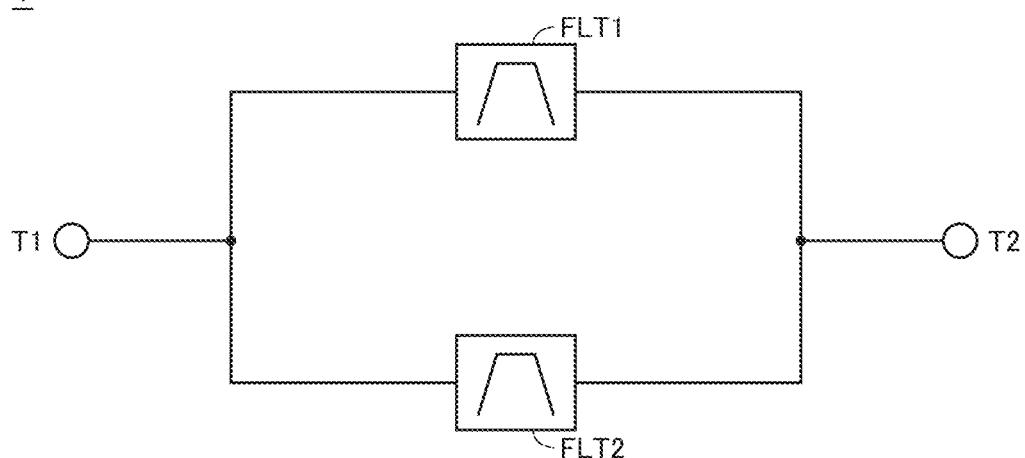
FIG. 1 is a circuit configuration diagram of a filter device according to an embodiment.

The embodiments of the present disclosure will now be described in detail with reference to the accompanying drawings, in which the same or corresponding components will be designated by the same reference characters, and description thereof will not be basically repeated.

FIG. 1 is a circuit configuration diagram of a filter device 1 according to an embodiment. As shown in FIG. 1, filter device 1 includes a filter FLT1 (first filter), a filter FLT2 (second filter), an input-output terminal T1 (first terminal), and an input-output terminal T2 (second terminal). Filters FLT1 and FLT2 are connected in parallel with each other between input-output terminals T1 and T2. Specifically, filter FLT1 has a first terminal connected to input-output terminal T1 and a second terminal connected to input-output terminal T2. Filter FLT2 has a first terminal connected to input-output terminal T1 and a second terminal connected to input-output terminal T2.

Filter FLT1 includes multiple elastic wave resonators. Filter FLT2 may include an elastic wave resonator or an LC resonator circuit. The elastic wave resonator is, for example, a surface acoustic wave (SAW) resonator, a bulk acoustic wave (BAW) resonator, a film bulk acoustic wave resonator (FBAR), or a solidly mounted (SM) resonator.

Figure 2:
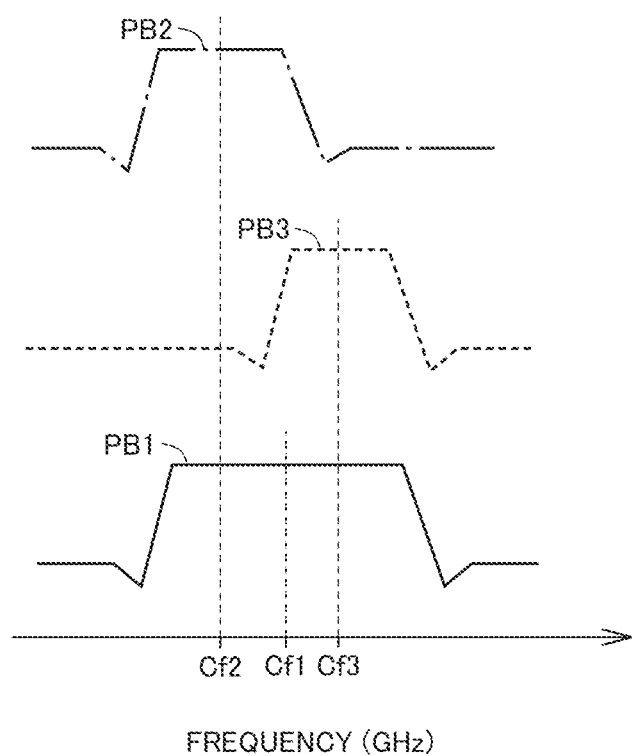
FIG. 2 is a graph that shows a frequency band relation among a passband of the filter device, a passband of a low band sided filter, and a passband of a high band sided filter in FIG. 1.

FIG. 2 is a graph that shows the relation among a passband PB1 (first passband) of filter device 1, a passband PB2 (second passband) of filter FLT1, and a passband PB (third passband) of filter FLT2 in FIG. 1. In FIG. 2, frequencies Cf1 to Cf3 are center frequencies of passbands PB1 to PB3, respectively. Herein, the passband refers to any consecutive frequency bands in which an insertion loss falls within the range from a minimum value of the insertion loss to a value obtained by adding 3 dB to the minimum value (i.e., 3 dB down from the minimum value).

As shown in FIG. 2, passband PB1 overlaps with a part of passband PB2 and a part of passband PB3. Passband PB2 is narrower than passband PB1. Passband PB3 is narrower than passband PB1. A center frequency Cf3 of passband PB3 is higher than a center frequency Cf2 of passband PB2. Of passband PB1, a frequency band lower than center frequency Cf1 is mainly formed by filter FLT1, and a frequency band higher than center frequency Cf1 is mainly formed by filter FLT2. Filter FLT1 is a filter that forms passband PB2, which is called a low band sided filter. Filter FLT2 is a filter that forms passband PB3, which is called a high band sided filter.

As recognized by the present inventor, when a filter is configured using a parallel arm circuit having an elastic wave resonator and a series arm circuit having an elastic wave resonator, usually, in a frequency band higher than the antiresonance frequency of the elastic wave resonator configuring the filter, the elastic wave resonator has a capacitive impedance, and the elastic wave resonator functions as a capacitor. Herein, in a frequency band higher than the antiresonance frequency, the reflection coefficient of the elastic wave resonator falls below the reflection coefficient at the antiresonance frequency.

Figure 3:
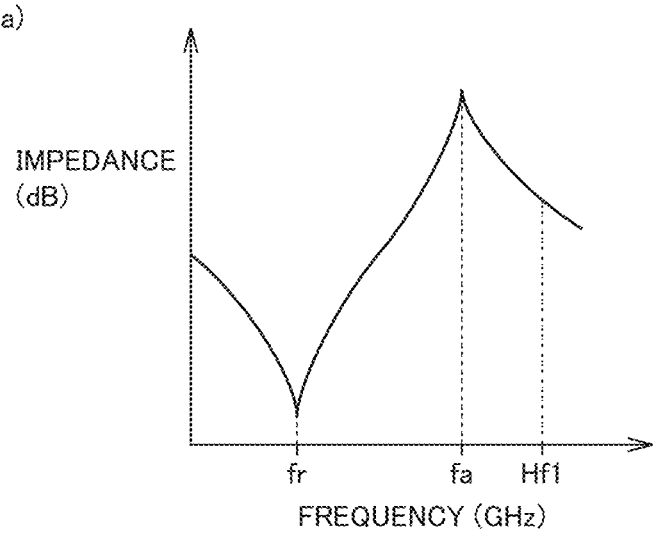
FIG. 3(a) is a graph showing a frequency characteristic of an absolute value of an impedance of an elastic wave resonator included in the filter in FIG. 1
FIG. 3(b) is a Smith chart showing a frequency characteristic of the impedance.
Figure 3:
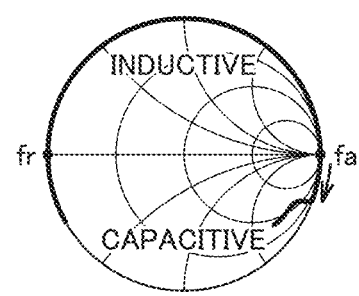

FIG. 3(a) is a graph showing a frequency characteristic of an absolute value of an impedance of an elastic wave resonator included in filter FLT1 in FIG. 1 and FIG. 3(b) a Smith chart showing a frequency characteristic of the impedance. In FIGS. 3(a) and 3(b), frequencies fr and fa represent a resonance frequency and an antiresonance frequency of an elastic wave resonator, respectively. A frequency Hf1, which is higher than antiresonance frequency fa, is a frequency at a high band edge of a stop band in the elastic wave resonator.

As shown in FIG. 3(a), the impedance of the elastic wave resonator has a minimum at resonance frequency fr and a maximum at antiresonance frequency fa. As shown in FIG. 3(b), the impedance of the elastic wave resonator is located at a point at which a real-part component and an imaginary-part component are extremely small at resonance frequency fr and is located at a point at which the real-part component or the imaginary-part component is extremely large at antiresonance frequency fa. As the frequency exceeds antiresonance frequency fa, the impedance of the elastic wave resonator moves clockwise on the Smith chart to become a capacitive impedance.

Herein, at frequencies higher than frequency Hf1 which is the high band edge of the stop band of the elastic wave resonator, the reflection coefficient of the elastic wave resonator is smaller than the reflection coefficient at antiresonance frequency fa, as described above. This is because a reflection loss increases as a bulk wave in the elastic wave resonator leaks out of the elastic wave resonator, which deteriorates the Q characteristics of this elastic wave resonator (leakage loss). This deteriorates an insertion loss of filter device 1 at the high band edge of passband PB1.

In the embodiment, thus, a capacitor is connected in parallel with an elastic wave resonator included in a low band sided filter. The Q characteristics of the capacitor do not deteriorate at frequencies higher than antiresonance frequency fa of the elastic wave resonator. Since the power to be applied is distributed to the elastic wave resonator and the capacitor, a bulk wave loss in the elastic wave resonator decreases, leading to improved Q characteristics of a circuit including the elastic wave resonator and the capacitor connected in parallel. Consequently, an insertion loss at the high band edge of the passband of the filter device according to an embodiment can be reduced.

Embodiments 1 to 4 will specifically describe a configuration of a low band sided filter of a filter device according to an embodiment. It is assumed below that a parallel arm circuit is a circuit disposed between a ground and a connecting point on a path connecting a first input-output terminal and a second input-output terminal, and that a series arm circuit is a circuit disposed between the first input-output terminal or the second input-output terminal and a connecting point on the path to which the parallel arm circuit is connected, or a circuit disposed between a connecting point on the path to which the parallel arm circuit is connected and another connecting point on the path to which another parallel arm circuit is connected. Each of the series arm circuit and the parallel arm circuit may be formed of one elastic wave resonator or reactance element (e.g., inductor or capacitor). Each of the series arm circuit and the parallel arm circuit may include multiple elastic wave resonators divided in series or in parallel.

Embodiment 1

Embodiment 1 will describe a case where a capacitor is connected in parallel with an elastic wave resonator included in a parallel arm circuit.

Figure 4:
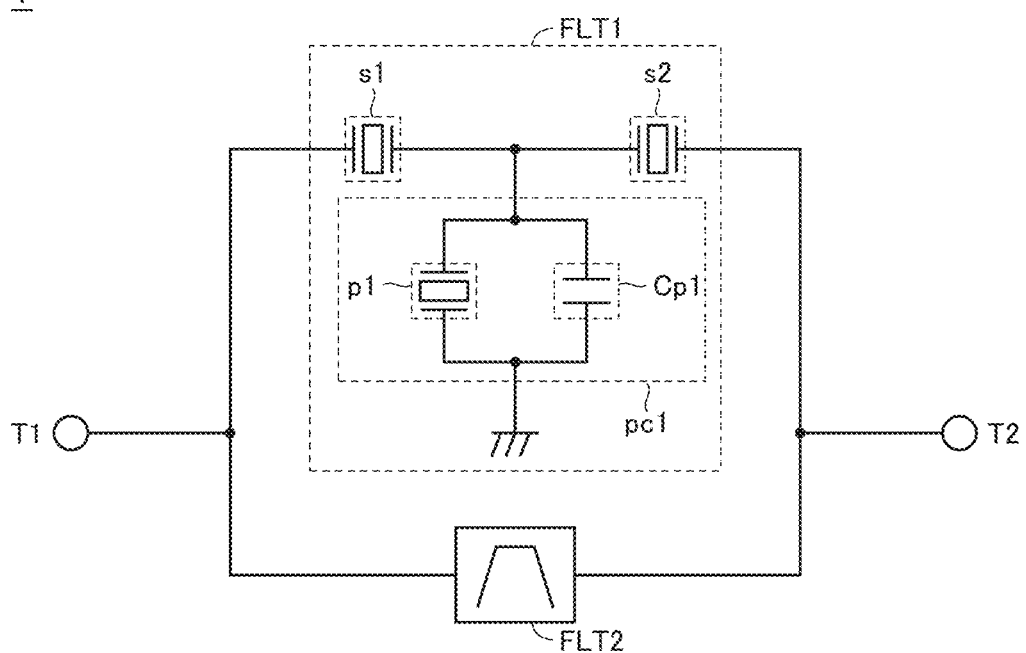
FIG. 4 is a circuit configuration diagram specifically showing a configuration of the low band sided filter in FIG. 1.

FIG. 4 is a circuit configuration diagram specifically showing a configuration of filter FLT1 in FIG. 1. As shown in FIG. 4, filter FLT1 includes series arm resonators s1 and s2, a parallel arm resonator p1 (first elastic wave resonator), and a capacitor Cp1 (first capacitive element).

Series arm resonators s1 and s2 are connected in series between input-output terminals T1 and T2. Each of series arm resonators s1 and s2 forms a series arm circuit. Parallel arm resonator p1 and capacitor Cp1 are connected in parallel with each other between a grounding point and a connecting point between series arm resonators s1 and s2. Parallel arm resonator p1 and capacitor Cp1 form a parallel arm circuit pc1.

Table 1 below shows resonance frequency fr, antiresonance frequency fa, a fractional bandwidth BWR, and a capacitance of each of series arm resonators s1 and s2, parallel arm resonator p1, and parallel arm circuit pc1 in Embodiment 1. Capacitance alone is shown for capacitor Cp1. Herein, fractional bandwidth BWR shows a value obtained by dividing a difference between antiresonance frequency fa and resonance frequency fr by resonance frequency fr on a percentage basis.

TABLE 1

| | | | fr [MHz] | fa [MHz] | BWR [%] | Capacitance [pF] |
|---|---|---|---|---|---|---|
| Series arm circuit | Series arm resonator | s1 | 1429.9 | 1486.4 | 3.950 | 2.655 |
| Series arm circuit | Series arm resonator | s2 | 1429.9 | 1486.4 | 3.950 | 2.712 |
| Parallel arm circuit | Parallel arm resonator | p1 | 1395.0 | 1452.0 | 4.090 | 4.047 |
| | Capacitive element | Cp1 | — | — | — | 0.556 |
| | | pc1 | 1395.0 | 1445.0 | 3.585 | 4.603 |

Figure 5:
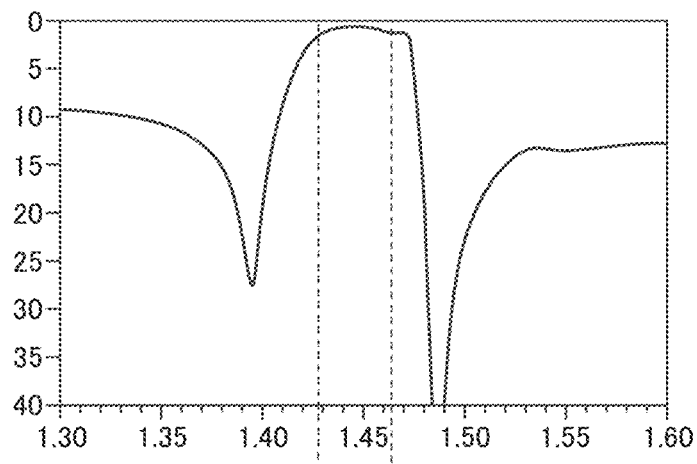
FIG. 5(a), FIG. 5(b), and FIG. 5(c) are graphs showing respective pass characteristics of the low band sided filter, the high band sided filter, and the filter device according to Embodiment 1.
Figure 5:
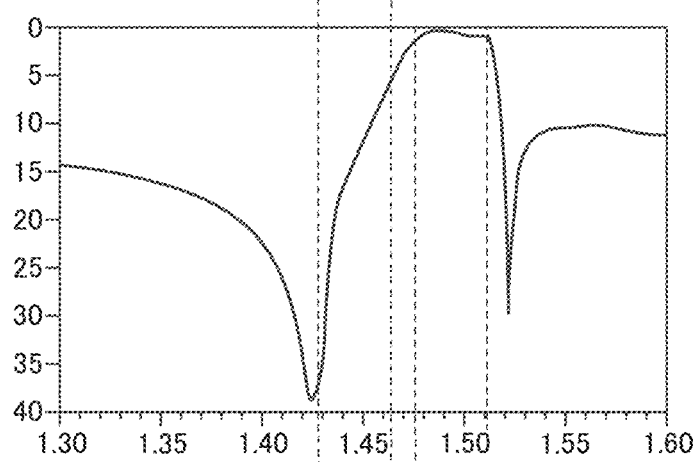
Figure 5:
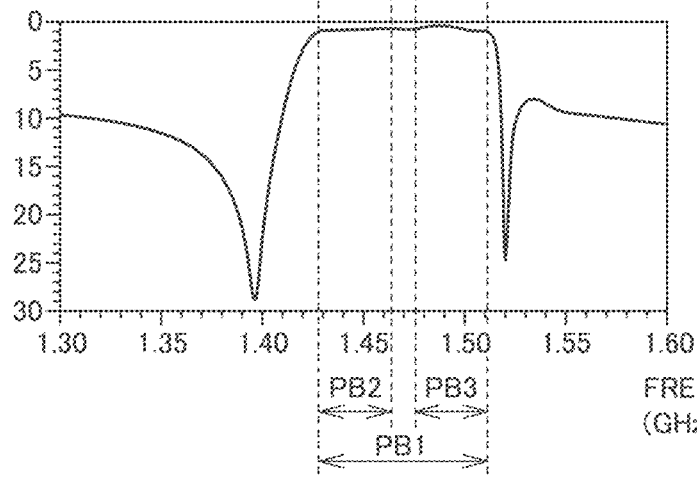

FIG. 5 shows pass characteristics of low band sided filter FLT1, high band sided filter FLT2, and filter device 1 according to Embodiment 1. FIG. 5(a) shows the pass characteristic (a frequency characteristic of an insertion loss and an amount of attenuation) of low band sided filter FLT1. FIG. 5(b) shows the pass characteristic of high band sided filter FLT2. FIG. 5(c) shows the pass characteristic of filter device 1 in FIG. 4. Herein, "a pass characteristic of a filter" refers to a pass characteristic of a filter alone, which is a pass characteristic when the filter is separated from any other circuit.

As shown in FIG. 5(a), low band sided filter FLT1 forms a low band sided side of passband PB1 of filter device 1 and has passband PB2. As shown in FIG. 5(b), high band sided filter FLT2 forms a high band sided side of passband PB1 of filter device 1 and has passband PB3. As noted above. FIG. 5(c) shows the pass characteristic of filter device 1 in FIG. 4. As illustrated, in a frequency band between a first passband (PB2) and a second passband (PB3), an insertion loss of the filter device 1 is smaller than an insertion loss of either filter in the filter frequency band between PB2 and PB3. Also as illustrated, the passband of the filter device 1 contains no discontinuities.

Figure 6:
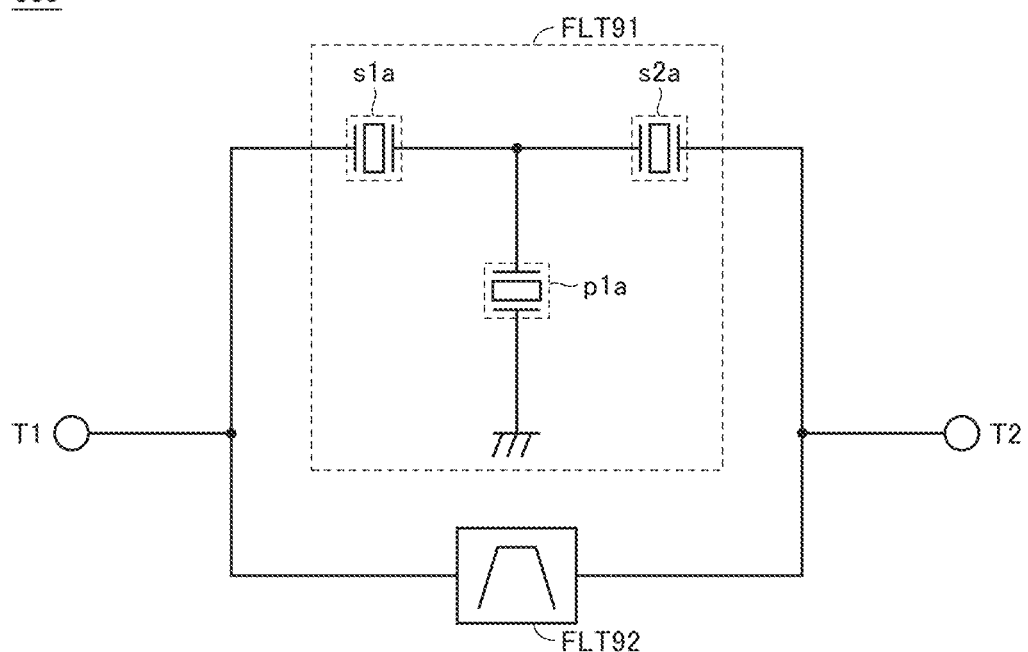
FIG. 6 is a circuit configuration diagram of a filter device according to a comparative example.

FIG. 6 is a circuit configuration diagram of a filter device 900 according to a comparative example. The components of filter device 900 are obtained by replacing filters FLT1 and FLT2 of filter device 1 in FIG. 4 with filters FLT91 and FLT92, respectively. Series arm resonators s1a and s2a and parallel arm resonator p1a included in FLT91 correspond to series arm resonators s1 and s2 and parallel arm resonator p1 in FIG. 4, respectively, as comparison targets. In filter device 900, no capacitor is connected in parallel with parallel arm resonator p1a. Filter device 900 and filters FLT91 and FLT92 are designed to have passbands PB1, PB2, and PB3, respectively. Table 2 below shows resonance frequency fr, antiresonance frequency fa, fractional bandwidth BWR, and a capacitance of each of series arm resonators s1a and s2a and parallel arm resonator plain Embodiment 1.

TABLE 2

| | | | fr [MHz] | fa [MHz] | BWR [%] | Capacitance [pF] |
|---|---|---|---|---|---|---|
| Series arm circuit | Series arm resonator | s1a | 1431.3 | 1487.8 | 3.945 | 2.611 |
| Series arm circuit | Series arm resonator | s2a | 1426.8 | 1483.3 | 3.963 | 3.693 |
| Parallel arm circuit | Parallel arm resonator | p1a | 1395.0 | 1452.0 | 4.090 | 4.991 |

Figure 7:
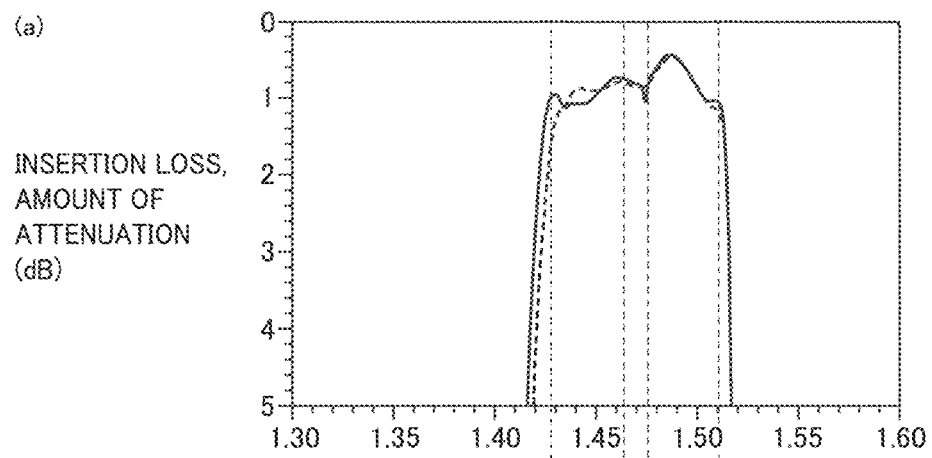
FIG. 7(a), FIG. 7(b), and FIG. 7(c) are graphs showing respective pass characteristics of the filter devices, reflection characteristics of low band sided filters, and reflection characteristics of parallel arm circuits according to Embodiment 1 and the comparative example.
Figure 7:
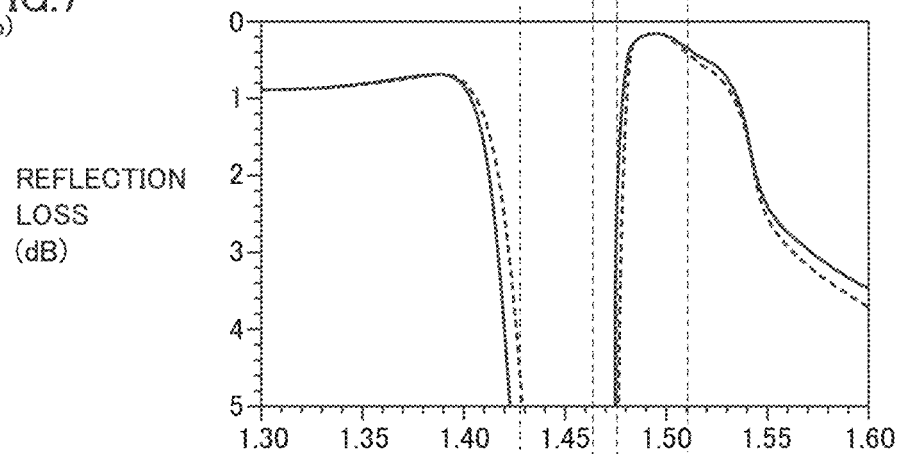
Figure 7:
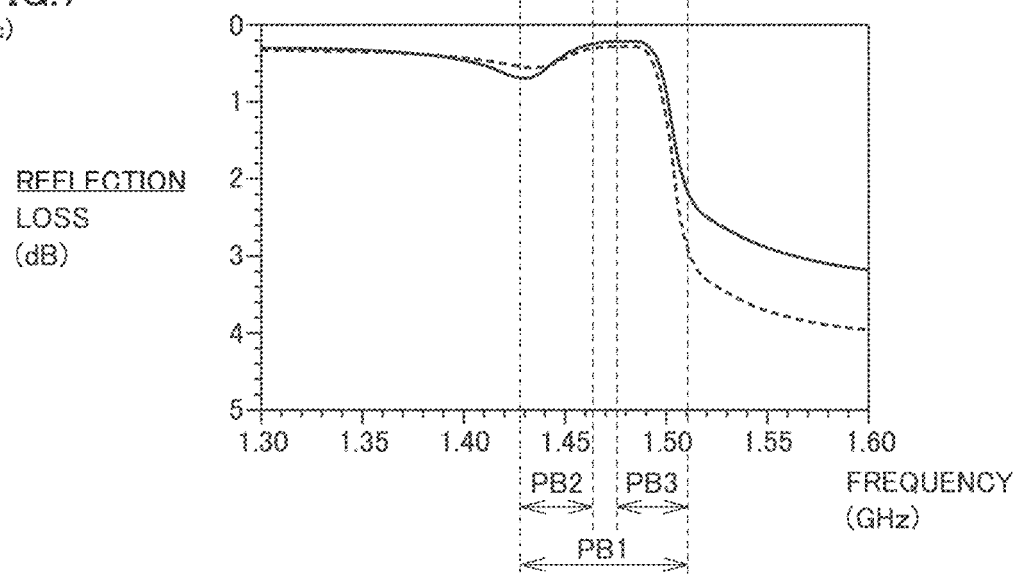

FIGS. 7(a), (b), and (c) respectively show pass characteristics of the filter devices, reflection characteristics of low band sided filters, and reflection characteristics of parallel arm circuits according to Embodiment 1 and the comparative example. FIG. 7(a) shows the pass characteristic of filter device 1 and the pass characteristic of filter device 900 in the range of amount of attenuation from 0 to 5 dB. FIG. 7(b) shows the reflection characteristic (a frequency characteristic of a reflection loss) of filter FLT1 in FIG. 4 and reflection characteristic of filter FLT91 in FIG. 6. FIG. 7(c) shows the reflection characteristic of parallel arm circuit pc1 of filter FLT1 in FIG. 4 and the reflection characteristic of parallel arm resonator p1a of filter FLT91 in FIG. 6. Herein, "a reflection characteristic of a filter" refers to a reflection characteristic of a filter alone, which is a reflection characteristic when the filter is separated from any other circuit, and "a reflection characteristic of a parallel arm circuit" refers to a reflection characteristic of a parallel arm circuit alone, which is a reflection characteristic when the parallel arm circuit is separated from any other circuit.

In FIG. 7(a), the solid line indicates the pass characteristic of filter device 1, and the dotted line indicates the pass characteristic of filter device 900. In FIG. 7(b), the solid line indicates the reflection characteristic of filter FLT1, and the dotted line indicates the reflection characteristic of filter FLT91. In FIG. 7(c), the solid line indicates the reflection characteristic of parallel arm circuit pc1, and the dotted line indicates the reflection characteristic of parallel arm resonator p1a.

As shown in FIG. 7(a), the insertion loss of filter device 1 is smaller than the insertion loss of filter device 900 at the high band edge of passband PB1. As shown in FIG. 7(b), the reflection loss of filter FLT1 is smaller than the reflection loss of filter FLT91 at the high band edge of passband PB1. As shown in FIG. 7(c), the reflection loss of parallel arm circuit pc1 is smaller than the reflection loss of parallel arm circuit p1a at the high band edge of passband PB1.

At the high band edge of passband PB1, the reflection characteristic of filter FLT1 is improved by improving the reflection characteristic of parallel arm circuit pc1. As a result, the pass characteristic of filter device 1 is improved.

Modification of Embodiment 1

Figure 8:
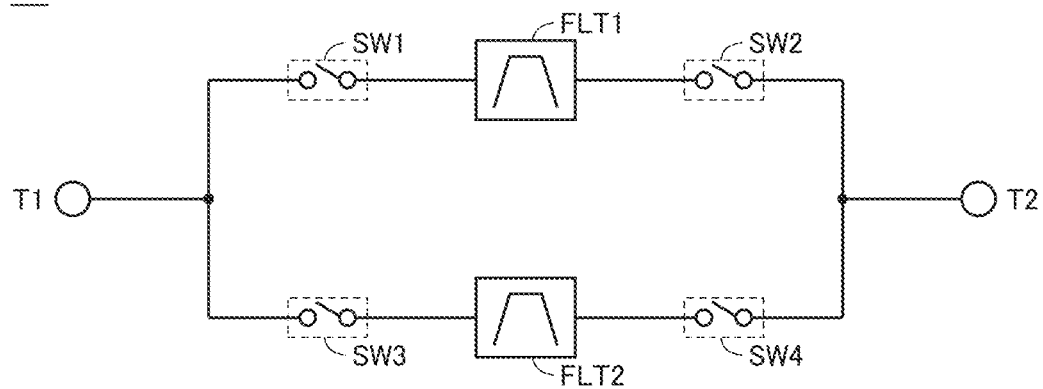
FIG. 8 is a circuit configuration diagram of a filter device according to a modification of Embodiment 1.

The filter device according to Embodiment 1 may have a variable passband. FIG. 8 is a circuit configuration diagram of a filter device 1A according to a modification of Embodiment 1. The components of filter device 1A include switches SW1 to SW4 in addition to the components of filter device 1 in FIG. 4. The other components are similar to those of filter device 1, description of which will not be repeated.

As shown in FIG. 8, switch SW1 (second switch) is connected between input-output terminal T1 and filter FLT1. Switch SW2 (third switch) is connected between input-output terminal T2 and filter FLT1. Switch SW3 (fourth switch) is connected between input-output terminal T1 and filter FLT2. Switch SW4 (fifth switch) is connected between input-output terminal T2 and filter FLT2. The conductive states (ON or OFF) of switches SW1 and SW2 are synchronous with each other. The conductive states of switches SW3 and SW4 are synchronous with each other.

The conductive states of switches SW1 to SW4 are switched in accordance with a control signal from a control circuit included in a radio frequency (RF) integrated circuit (RFIC), which is not shown. The control circuit may be provided separately from the RFIC.

When the conductive states of switches SW1 and SW2 are ON and the conductive states of switches SW3 and SW4 are OFF, the passband of filter device 1A is passband PB2 of filter FLT1. When the conductive states of switches SW1 and SW2 are OFF and the conductive states of switches SW3 and SW4 are ON, the passband of filter device 1A is passband PB3 of filter FLT2. When the conductive states of switches SW1 to SW4 are ON, the passband of filter device 1A is PB1.

Not all of switches SW1 to SW4 are required to allow the filter device according to Embodiment 1 to have a variable passband. For example, the filter device can have a variable passband by including any one of a combination of switches SW1 and SW2 and a combination of switches SW3 and SW4.

In the case where the filter device includes switches SW1 and SW2 and does not include switches SW3 and SW4, the passband of the filter device is PB1 when switches SW1 and SW2 are ON. When switches SW1 and SW2 are OFF, the passband of the filter device is passband PB3 of filter FLT2.

In the case where the filter device does not include switches SW1 and SW2 and includes witches SW3 and SW4, the passband of the filter device is PB1 when switches SW3 and SW4 are ON. When switches SW3 and SW4 are OFF, the passband of the filter device is passband PB2 of filter FLT1.

As described above, the filter devices according to Embodiment 1 and the modification can reduce an insertion loss at the high band edge of a passband.

Embodiment 2

Embodiment 2 will describe a case where a capacitor is connected in parallel with an elastic wave resonator included in a series arm circuit.

Figure 9:
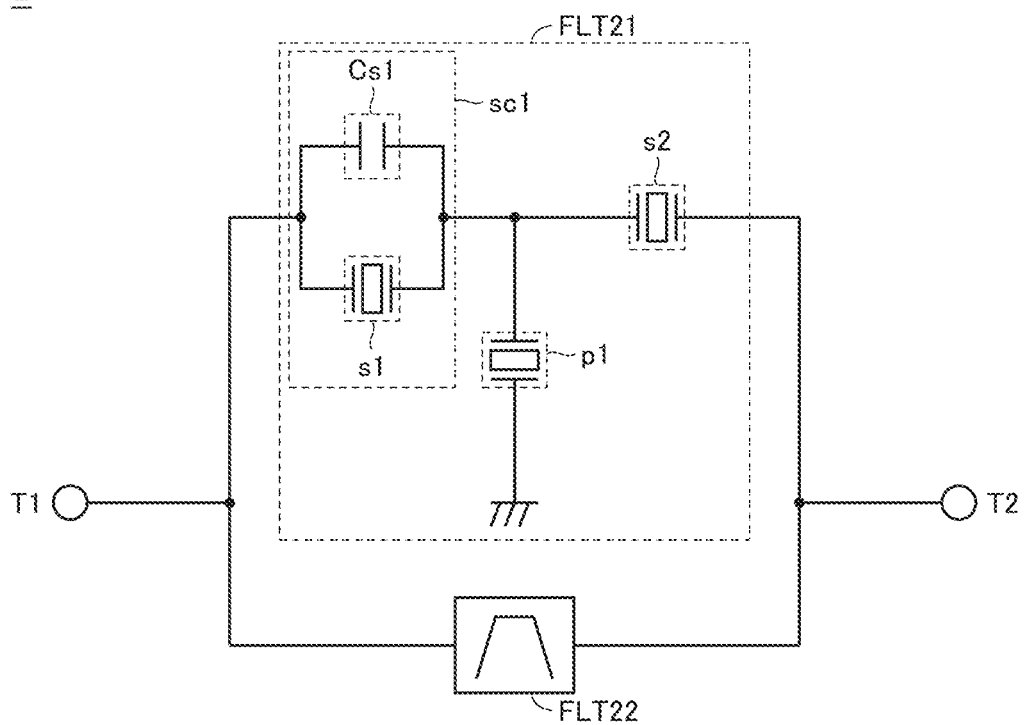
FIG. 9 is a circuit configuration diagram of a filter device according to Embodiment 2.

FIG. 9 is a circuit configuration diagram of a filter device 2 according to Embodiment 2. The components of filter device 2 are obtained by replacing filters FLT1 and FLT2 in FIG. 4 with filters FLT21 and FLT22. The passbands of filter device 2, filter FLT21 (first filter), and filter FLT22 (second filter) are a passband PB21 (first passband), a passband PB22 (second passband), and a passband PB23 (third passband), respectively. Filter FLT22 may include an elastic wave resonator or an LC resonance circuit. Filter FLT21 is a low band sided filter, and filter FLT22 is a high band sided filter.

Passband PB21 includes part of passband PB22 and part of passband PB23. Passband PB22 is narrower than passband PB21. Passband PB23 is narrower than passband PB21. Passband PB23 has a center frequency higher than the center frequency of passband PB22.

As shown in FIG. 9, filter FLT21 has a configuration in which capacitor Cp1 is removed from the configuration of filter FLT1 in FIG. 4 and a capacitor Cs1 (first capacitive element) is added thereto. Capacitor Cs1 is connected in parallel with series arm resonator s1 (first elastic wave resonator). Series arm resonator s1 and capacitor Cs1 form a series arm circuit sc1.

Table 3 below shows resonance frequency fr, antiresonance frequency fa, fractional bandwidth BWR, and a capacitance of each of series arm resonators s1 and s2, parallel arm resonator p1, and series arm circuit sc1 in Embodiment 2. Capacitance alone is shown for capacitor Cs1.

TABLE 3

| | | | fr [MHz] | fa [MHz] | BWR [%] | Capacitance [pF] |
|---|---|---|---|---|---|---|
| Series arm circuit | Series arm resonator | s1 | 1439.4 | 1495.7 | 3.912 | 2.267 |

TABLE 3-continued

|  |  |  | fr [MHz] | fa [MHz] | BWR [%] | Capacitance [pF] |
|---|---|---|---|---|---|---|
|  | Capacitive element | Cs1 | — | — | — | 0.647 |
|  |  | sc1 | 1439.4 | 1483.0 | 3.029 | 2.914 |
| Series arm circuit | Series arm resonator | s2 | 1430.0 | 1486.5 | 3.950 | 2.714 |
| Parallel arm circuit | Parallel arm resonator | p1 | 1392.7 | 1449.8 | 4.099 | 4.400 |

Filter device 2 will be compared below with filter device 900 shown in FIG. 6. The components of filter device 900 are obtained by removing capacitor Cs1 from filter device 2 in FIG. 9. Filter device 900, filter FLT91, and filter FLT92 are designed to have passbands PB21, PB22, and PB23, respectively. Table 4 below shows resonance frequency fr, antiresonance frequency fa, fractional bandwidth BWR, and a capacitance of each of series arm resonators s1a and s2a and parallel arm resonator plain Embodiment 2.

TABLE 4

|  |  |  | fr [MHz] | fa [MHz] | BWR [%] | Capacitance [pF] |
|---|---|---|---|---|---|---|
| Series arm circuit | Series arm resonator | s1a | 1429.8 | 1486.3 | 3.951 | 2.900 |
| Series arm circuit | Series arm resonator | s2a | 1427.1 | 1483.6 | 3.962 | 4.053 |
| Parallel arm circuit | Parallel arm resonator | p1a | 1389.7 | 1446.8 | 4.111 | 3.796 |

Figure 10:
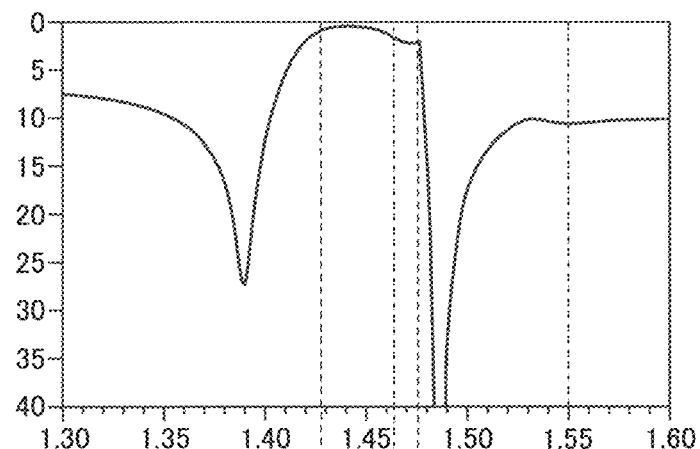
FIG. 10(a), FIG. 10(b), and FIG. 10(c) are graphs respectively showing pass characteristics of a low band sided filter, a high band sided filter, and the filter device according to Embodiment 2.
Figure 10:
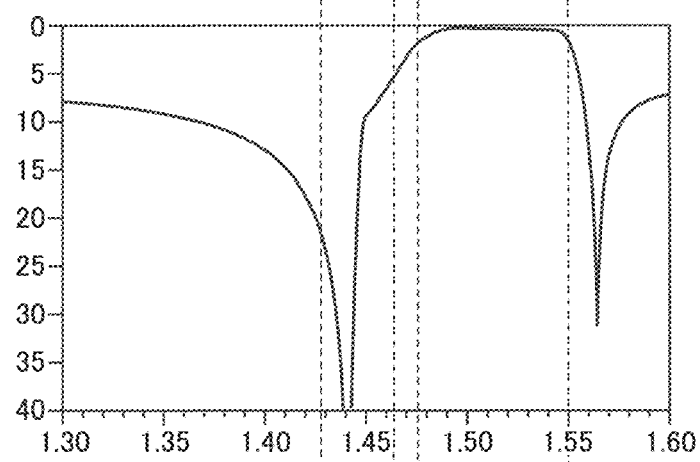
Figure 10:
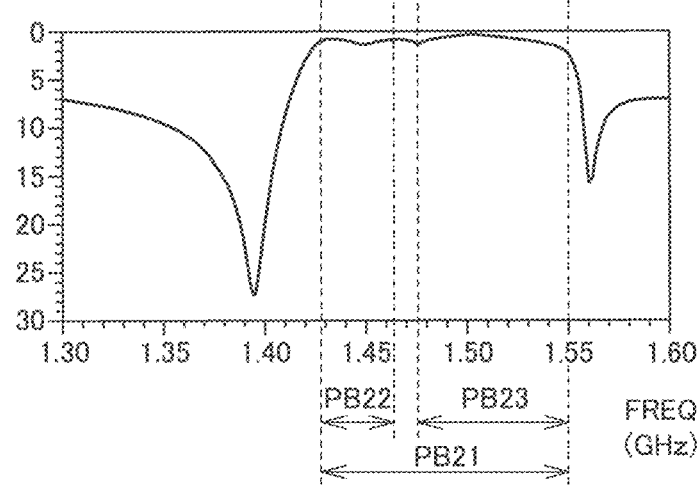

FIGS. 10(a), (b), and (c) respectively show pass characteristics of low band sided filter FLT21, high band sided filter FLT22, and filter device 2 in FIG. 9. FIG. 10(a) shows the pass characteristic of low band sided filter FLT21. FIG. 10(b) shows the pass characteristic of high band sided filter FLT22. FIG. 10(c) shows the pass characteristic of filter device 2 in FIG. 9.

As shown in FIG. 10(a), low band sided filter FLT21 forms the low band sided side of passband PB21 of filter device 2 and has passband PB22. As shown in FIG. 10(b), high band sided filter FLT22 forms the high band sided side of passband PB21 of filter device 2 and has passband PB23. As noted above, FIG. 10(c) shows the pass characteristic of filter device 2 in FIG. 9. As illustrated, in a frequency band between passband PB22 and passband PB23, an insertion loss of the filter device 2 is smaller than an insertion loss of either filter in the frequency band between passband PB22 and passband PB23. Also as illustrated, the passband of the filter device 2 contains no discontinuities.

Figure 11:
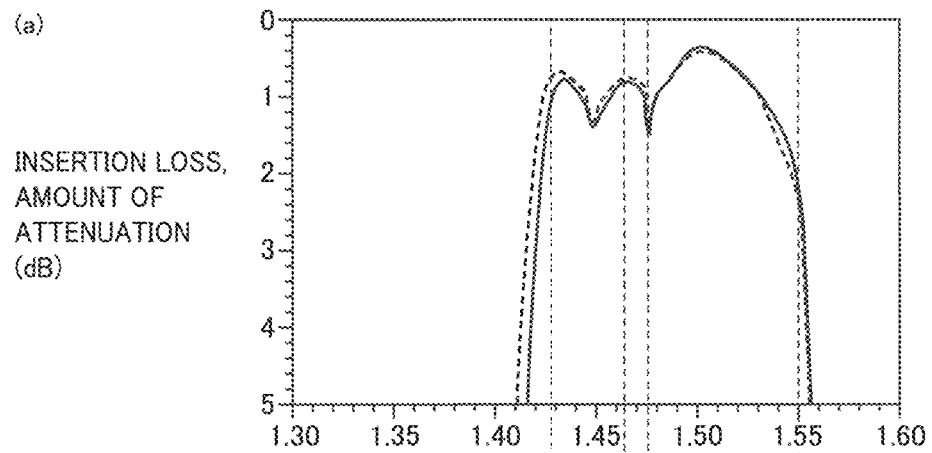
FIG. 11(a), FIG. 11(b), and FIG. 11(c) show respective pass characteristics of the filter devices, reflection characteristics of the low band sided filters, and reflection characteristics of the series arm circuits according to Embodiment 2 and the comparative example.
Figure 11:
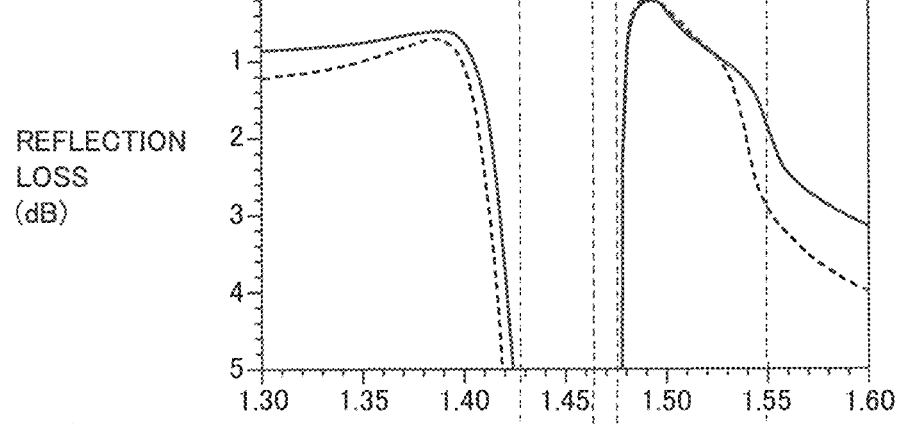
Figure 11:
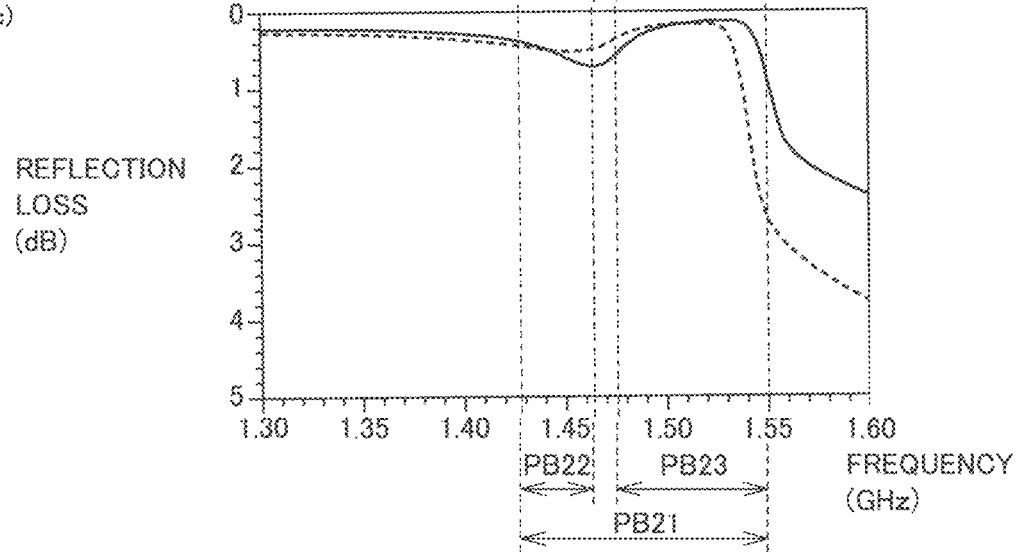

FIGS. 11(a), (b), and (c) respectively show pass characteristics of the filter devices, reflection characteristics of the low band sided filters, and reflection characteristics of the series arm circuits according to Embodiment 2 and the comparative example. FIG. 11(a) shows the pass characteristic of filter device 2 in FIG. 9 and the pass characteristic of filter device 900 in FIG. 6 in the range of amounts of attenuation from 0 to 5 dB in FIG. 10(c) in an enlarged manner. FIG. 11(b) shows the reflection characteristic of filter FLT21 in FIG. 9 and the reflection characteristic of filter FLT91 in FIG. 6. FIG. 11(c) shows the reflection characteristic of series arm circuit sc1 in FIG. 9 and the reflection characteristic of series arm resonator s1a in FIG. 6. In FIG. 11(a), the solid line indicates the pass characteristic of filter device 2 in FIG. 9, and the dotted line indicates the pass characteristic of filter device 900 in FIG. 6. In FIG. 11(b), the solid line indicates the reflection characteristic of filter FLT21, and the dotted line indicates the reflection characteristic of filter FLT91. In FIG. 11(c), the solid line indicates the reflection characteristic of series arm circuit sc1, which indicates the reflection characteristic of series arm resonator s1a. Herein, "a reflection characteristic of a series arm circuit" refers to the reflection characteristic of a series arm circuit alone, which is the reflection characteristic when the series arm circuit is separated from any other circuit.

As shown in FIG. 11(a), the insertion loss of filter device 2 is smaller than the insertion loss of filter device 900 at the high band edge of passband PB21. As shown in FIG. 11(b), the reflection loss of filter FLT21 is smaller than the reflection loss of filter FLT91 at the high band edge of passband PB21. As shown in FIG. 11(c), the reflection loss of series arm circuit sc1 is smaller than the reflection loss of series arm resonator s1a at the high band edge of passband PB21.

At the high band edge of passband PB21, the reflection characteristic of series arm circuit sc1 is improved, leading to an improved reflection characteristic of filter FLT21. Consequently, the pass characteristic of filter device 2 at the high band edge of passband PB21 is improved.

As described above, the filter device according to Embodiment 2 can reduce an insertion loss at the high band edge of a passband.

Embodiment 3

Embodiment 3 will describe a configuration in which the capacity of a capacitive element to be connected in parallel with an elastic wave resonator is increased while securing a desired passband in the low band sided filter, further reducing an insertion loss at the high band edge of the passband.

Figure 12:
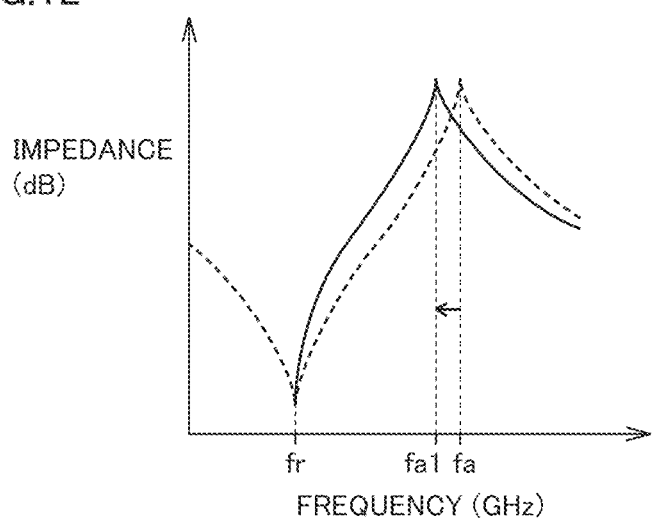
FIG. 12 is a graph that shows an impedance characteristic of an elastic wave resonator (dotted line) and an impedance characteristic of a circuit composed of an elastic wave resonator and a capacitor connected in parallel (solid line).

FIG. 12 shows an impedance characteristic of an elastic wave resonator (dotted line) and an impedance characteristic of a circuit composed of the elastic wave resonator and a capacitor connected in parallel (solid line). As shown in FIG. 12, the resonance frequency of the circuit composed of the elastic wave resonator and the capacitor connected in parallel is nearly the same as resonance frequency fr of the elastic wave resonator. On the other hand, an antiresonance frequency fa1 of the circuit is smaller than antiresonance frequency fa of the elastic wave resonator. As the capacity of the capacitor increases, antiresonance frequency fa1 decreases, leading to an increased difference between antiresonance frequencies fa1 and fa. As the difference between the resonance frequency and antiresonance frequency fa1 of the circuit decreases, it would be difficult to maintain a desired passband in a filter including the circuit.

In Embodiment 3, thus, in the low band sided filter, the fractional bandwidth of the elastic wave resonator which is connected in parallel with the capacitor is made larger than the fractional bandwidth of the elastic wave resonator which is not connected in parallel with the capacitor. As a result, for the capacity of the capacitor which is connected in parallel with the elastic wave resonator included in the low band sided filter, a limit of the capacity with which a desired passband can be maintained can be increased. This can further reduce the bulk wave loss of the elastic wave resonator connected in parallel with the capacitor. Consequently, the insertion loss at the high band edge of the passband of the filter device according to Embodiment 3 can be reduced further.

Figures 13A, 13B:
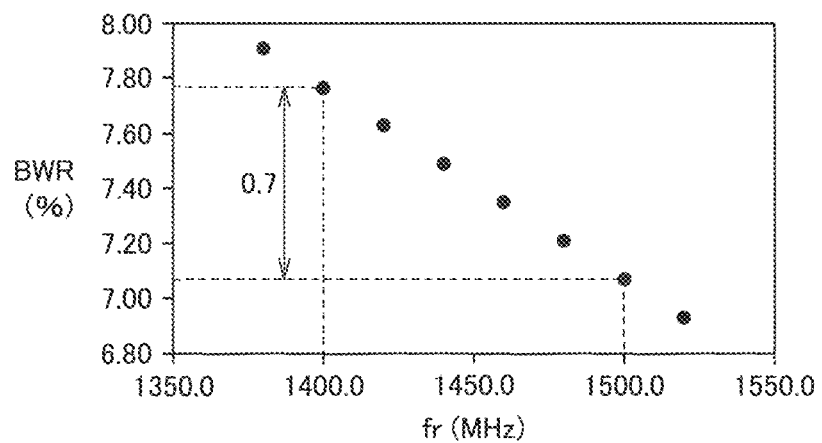
FIG. 13(a) is a chart.
FIG. 13(b) is an associated table, showing the relation between a resonance frequency and a fractional bandwidth of an elastic wave resonator according to an embodiment.

FIG. 13(a) is a chart, and FIG. 13(b) is an associated table of values, showing the relation between a resonance frequency and a fractional bandwidth (BWR) of a typical elastic wave resonator. As the resonance frequency of the elastic resonance is changed, fractional bandwidth BWR changes. When a typical filter device is configured using multiple elastic wave resonators, the frequency difference in resonance frequency of multiple elastic wave resonators is generally 100 MHz or less. As shown in FIG. 13(a), as resonance frequency is changed by 100 MHz, the fractional bandwidth changes by about 0.7%. It is thus assumed below that two fractional bandwidths are different from each other when the difference between the two fractional bandwidths is 0.8% or more, and that two fractional bandwidths are equal to each other when the difference between the two fractional bandwidths is less than 0.8%.

When the elastic wave resonator is a SAW resonator, the fractional bandwidth of the elastic wave resonator can be changed by providing a first adjustment film formed of an insulator or a dielectric body between interdigitated electrodes and a piezoelectric substrate and changing the thickness of the first adjustment film. The fractional bandwidth is largest in the absence of the first adjustment film, and the fractional bandwidth decreases with a larger thickness of the first adjustment film. Also, the fractional bandwidth of the SAW resonator can be changed by providing a second adjustment film formed of an insulator or a dielectric body in a manner of covering the interdigitated electrodes and changing the thickness of the second adjustment film. The fractional bandwidth is largest in the absence of the second adjustment film, and the fractional bandwidth decreases with a larger thickness of the second adjustment film.

When the elastic wave resonator is a BAW resonator, the fractional bandwidth can be changed by changing the material for a piezoelectric body between the opposing electrodes.

Figure 14:
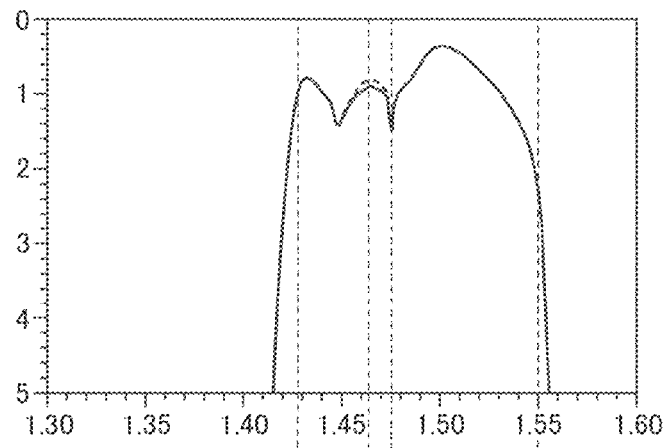
FIG. 14(a), FIG. 14(b), and FIG. 14(c) are respective graphs showing pass characteristics of filter devices, reflection characteristics of low band sided filters, and reflection characteristics of series arm circuits according to Embodiments 2 and 3.
Figure 14:
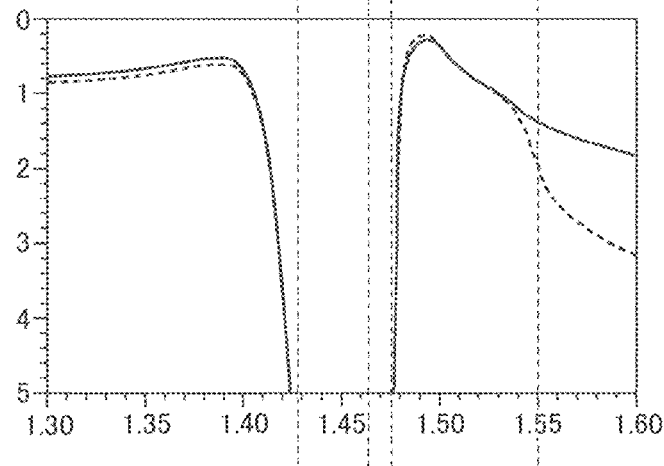
Figure 14:
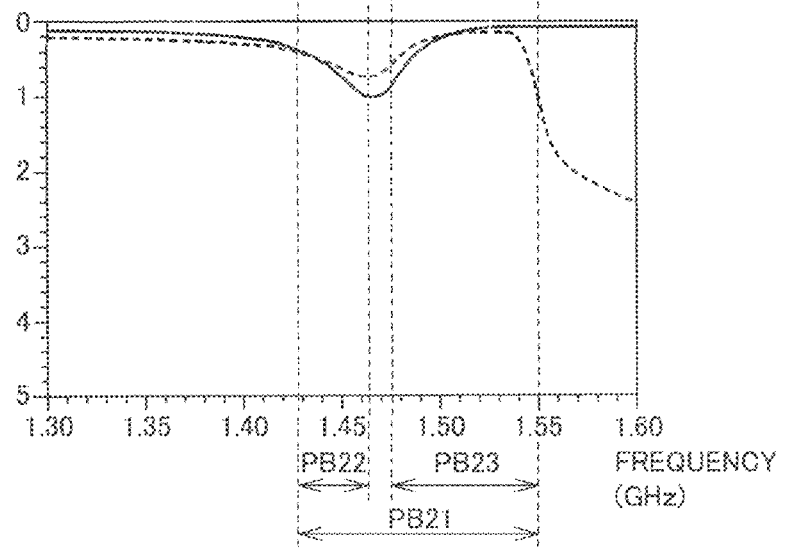
Figure 15:
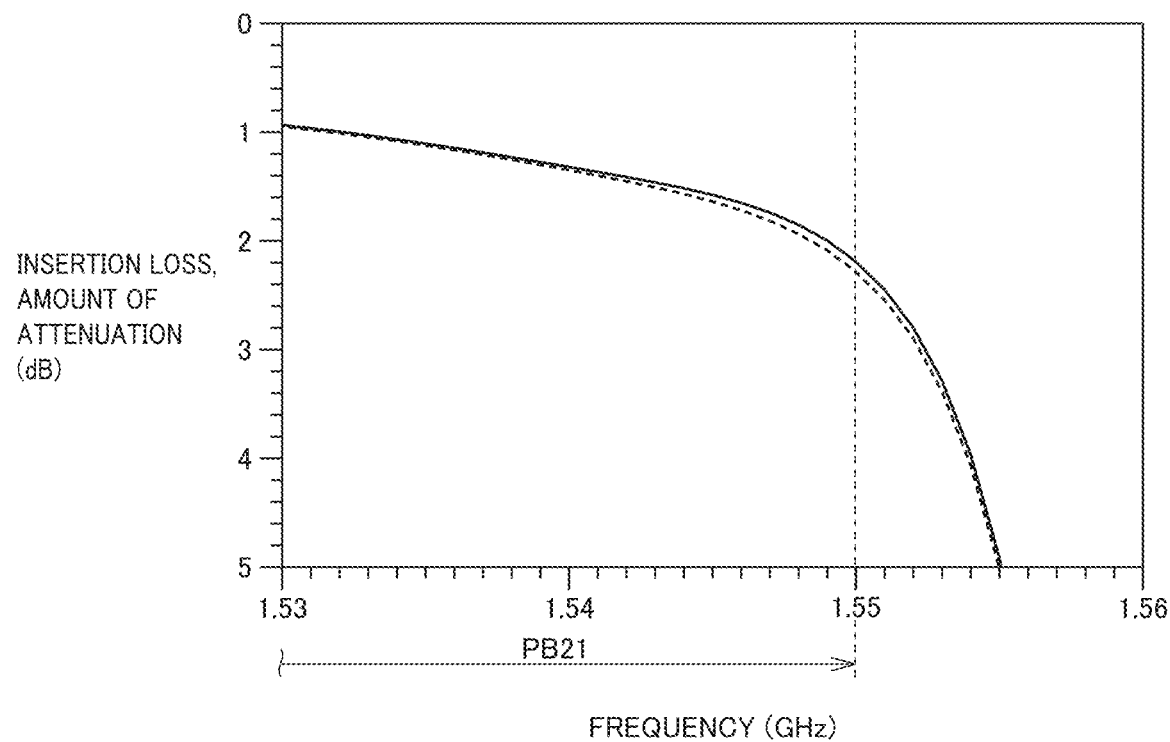
FIG. 15 is a graph that shows the pass characteristics in the range of 1.53 GHz to 1.56 GHz of FIG. 14(a) in an enlarged manner.

The frequency characteristic for the filter device according to Embodiment 3 will be compared with the frequency characteristic for filter device 2 in FIG. 9 with reference to FIGS. 14(a), (b), and (c) and FIG. 15. The circuit configuration of the filter device according to Embodiment 3 is the same as that of filter device 2 in FIG. 9. For fractional bandwidths, in filter device 2 in FIG. 9, the fractional bandwidth of series arm resonator s1 which is connected in parallel with capacitor Cs1 is equal to the fractional bandwidth of series arm resonator s2 (third elastic wave resonator) which is not connected in parallel with the capacitor. In the filter device according to Embodiment 3, the fractional bandwidth of series arm resonator s1 is larger than the fractional bandwidth of series arm resonator s2. The capacity of capacitor Cs1 in Embodiment 3 is higher than the capacity of capacitor Cs1 in FIG. 9. Table 5 below shows resonance frequency fr, antiresonance frequency fa, fractional bandwidth BWR, and a capacitance of each of series arm resonators s1 and s2, parallel arm resonator p1, and series arm circuit sc1 in Embodiment 3. Capacitance alone is shown for capacitor Cs1. The other components are similar to those of Embodiment 2, description of which will not be repeated.

TABLE 5

| | | | fr [MHz] | fa [MHz] | BWR [%] | Capacitance [pF] |
|---|---|---|---|---|---|---|
| Series arm circuit | Series arm resonator | s1 | 1439.4 | 1547.3 | 7.494 | 1.167 |
| | Capacitive element | Cs1 | — | — | — | 1.747 |
| | | sc1 | 1439.4 | 1483.0 | 3.029 | 2.914 |
| Series arm | Series arm | s2 | 1430.0 | 1486.5 | 3.950 | 2.714 |

TABLE 5-continued

| | | | fr [MHz] | fa [MHz] | BWR [%] | Capacitance [pF] |
|---|---|---|---|---|---|---|
| circuit | resonator | | | | | |
| Parallel arm circuit | Parallel arm resonator | p1 | 1392.7 | 1449.8 | 4.099 | 4.400 |

FIG. 14 shows pass characteristics of the filter devices, reflection characteristics of the low band sided filters, and reflection characteristics of the series arm circuits according to Embodiments 2 and 3. FIG. 14(a) shows the pass characteristic of the filter device according to Embodiment 3 (solid line) and the pass characteristic of filter device 2 in FIG. 9 (dotted line). FIG. 14(b) shows the reflection characteristic of the low band sided filter according to Embodiment 3 (solid line) and the reflection characteristic of filter FLT21 in FIG. 9 (dotted line). FIG. 14(c) shows the reflection characteristic of series arm circuit sc1 in Embodiment 3 (solid line) and the reflection characteristic of series arm circuit sc1 in FIG. 9 (dotted line). FIG. 15 shows the pass characteristics in the range of 1.53 GHz to 1.56 GHz in FIG. 14(a) in an enlarged manner.

As shown in FIG. 14(b), at the high band edge of passband PB21, the reflection loss of the low band sided filter according to Embodiment 3 is smaller than the reflection loss of filter FLT21. As shown in FIG. 14(c), the reflection loss of series arm circuit sc1 in Embodiment 3 is smaller than the reflection loss of series arm circuit sc1 in Embodiment 2. As shown in FIG. 15, at the high band edge of passband PB21, the insertion loss of the filter device according to Embodiment 3 is smaller than the insertion loss of filter device 2 according to Embodiment 2.

For series arm resonator s1 of Embodiment 3, as the fractional bandwidth is made larger than that of series arm resonator s1 in Embodiment 2, the frequency difference between the resonance frequency and a frequency at which a bulk wave loss occurs can be made greater than that in Embodiment 2. Herein, series arm resonator s1 of Embodiment 3 has nearly the same resonance frequency as that of series arm resonator s1 of Embodiment 2. Thus, in Embodiment 3, as the frequency difference between the resonance frequency and the frequency at which a bulk wave loss occurs is increased for series arm resonator s1 as described above, the frequency at which a bulk wave loss occurs can be made away from the high band edge of passband PB21. Consequently, the effect of the bulk wave loss in passband PB21 of the filter device according to Embodiment 3 is smaller than that of filter device 2 according to Embodiment 2.

As the fractional bandwidth is increased, the impedance of the elastic wave resonator can be increased (the capacitance value of the elastic wave resonator can be reduced), and also, the capacitance value of the capacitor connected in parallel with the elastic wave resonator can be increased. Of the power applied to an elastic wave resonator and a capacitor connected in parallel, the ratio of the power borne by the capacitor increases, which reduces the power applied to the elastic wave resonator.

The filter device according to Embodiment 3 can reduce a bulk wave loss in an elastic wave resonator more than the filter device according to Embodiment 2, and accordingly, can reduce the insertion loss at the high band edge of the passband more than the filter device according to Embodiment 2.

As described above, the filter device according to Embodiment 3 can reduce an insertion loss at the high band edge of a passband.

Embodiment 4

In a low band sided filter of a filter device according to an embodiment, a series arm circuit having an elastic wave resonator closest to an input-output terminal receives power from the input-output terminal directly and intensively. Thus, the elastic wave resonator included in the series arm circuit is likely to have a large bulk wave loss. Embodiment 4 will thus describe a case where a bulk wave loss is restrained more effectively by connecting a capacitor in parallel with an elastic wave resonator included in a series arm circuit closest to an input-output terminal in a low band sided filter.

Figure 16:
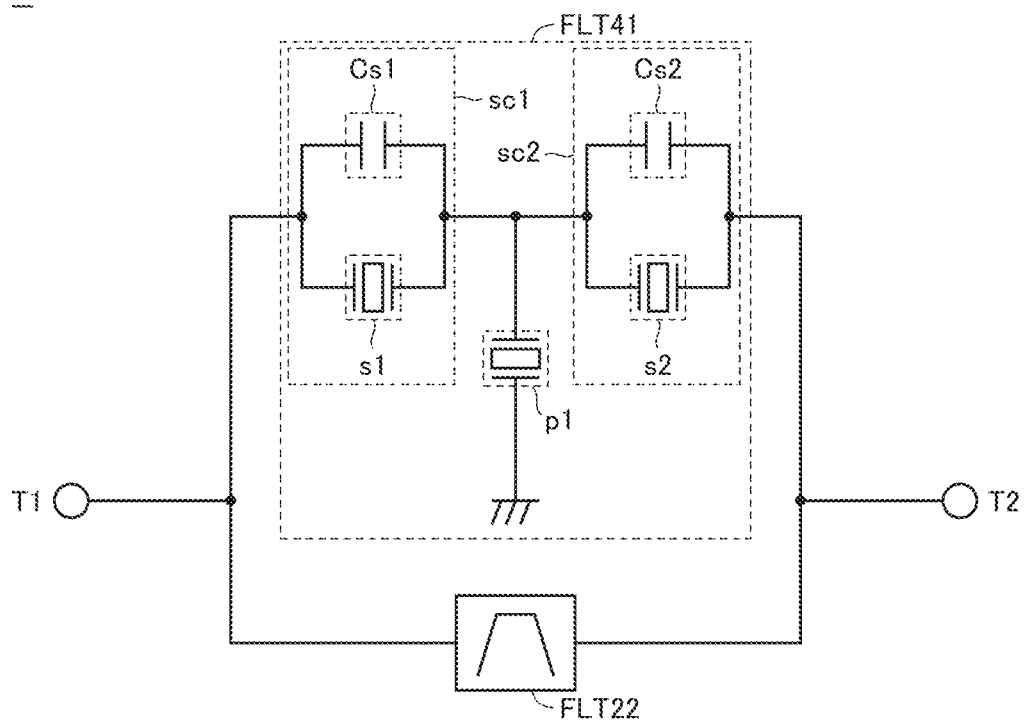
FIG. 16 is a circuit configuration diagram of a filter device according to Embodiment 4.

FIG. 16 is a circuit configuration diagram of a filter device 4 according to Embodiment 4. The components of filter device 4 are obtained by replacing filter FLT21 of filter device 2 in FIG. 9, which is referred to in Embodiment 3, with a filter FLT41. The components of filter FLT41 are obtained by adding a capacitor Cs2 to the components of filter FLT21 in FIG. 2. The other components are similar to those of Embodiment 3, description of which will not be repeated.

As shown in FIG. 16, capacitor Cs2 (second capacitive element) is connected in parallel with series arm resonator s2 (second elastic wave resonator). Series arm resonator s2 and capacitor Cs2 form series an arm circuit sc2 (second series arm resonator). Series arm resonator s2 has a fractional bandwidth larger than the fractional bandwidth of parallel arm resonator p1.

Series arm circuit sc1 (first series arm resonator) and series arm circuit sc2 are connected in series with each other between input-output terminals T1 and T2 with series arm circuits sc1 and sc2 at opposite ends. Series arm circuit sc1 is closest to input-output terminal T1. Series arm circuit sc2 is closest to input-output terminal T2. Table 6 below shows resonance frequency fr, antiresonance frequency fa, fractional bandwidth BWR, and a capacitance of each of series arm resonators s1 and s2, parallel arm resonator p1, and series arm circuits sc1 and sc2 in Embodiment 4. Capacitance alone is shown for capacitors Cs1 and Cs2.

TABLE 6

|  |  |  | fr [MHz] | fa [MHz] | BWR [%] | Capacitance [pF] |
|---|---|---|---|---|---|---|
| Series arm circuit | Series arm resonator | s1 | 1439.4 | 1547.3 | 7.494 | 1.167 |
|  | Capacitive element | Cs1 | — | — | — | 1.747 |
|  |  | sc1 | 1439.4 | 1483.0 | 3.029 | 2.914 |
| Series arm circuit | Series arm resonator | s2 | 1430.0 | 1538.1 | 7.560 | 1.414 |
|  | Capacitive element | Cs2 | — | — | — | 1.300 |
|  |  | sc2 | 1430.0 | 1487.0 | 3.986 | 2.714 |
| Parallel arm circuit | Parallel arm resonator | p1 | 1392.7 | 1449.8 | 4.099 | 4.400 |

Figure 17:
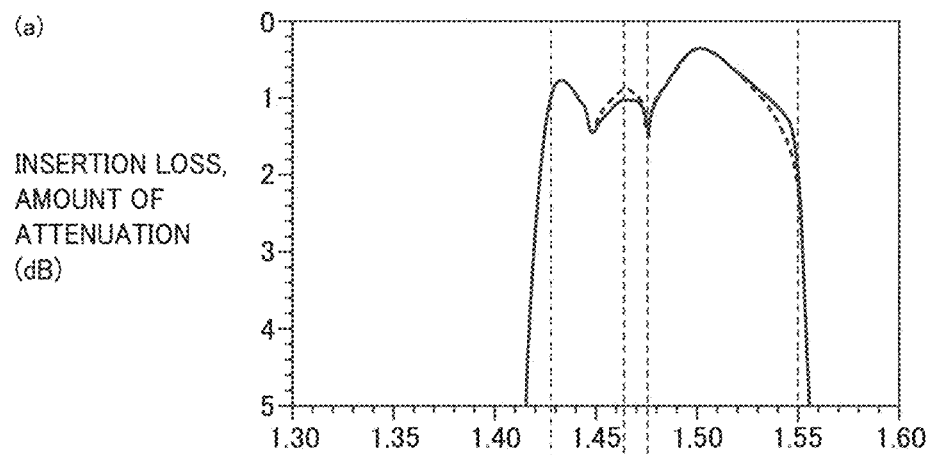
FIG. 17(a), FIG. 17(b), and FIG. 17(c) are respective graphs that show pass characteristics of the filter devices and reflection characteristics of low band sided filters according to Embodiments 3 and 4.
Figure 17:
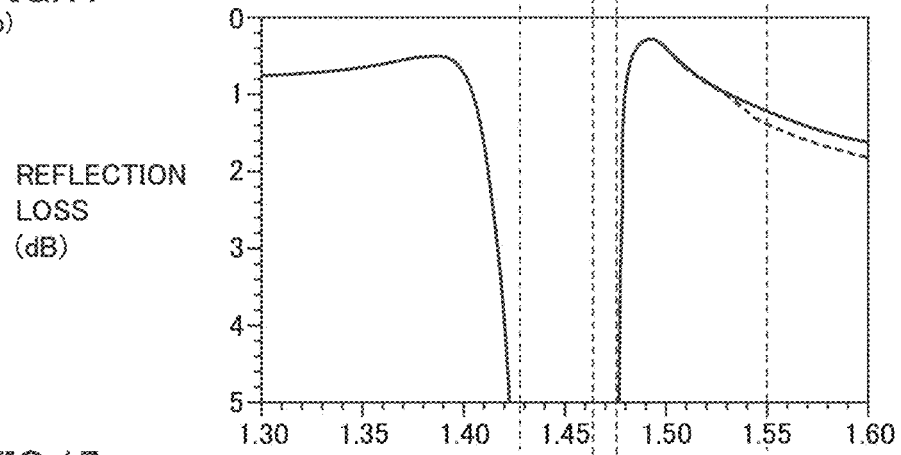
Figure 17:
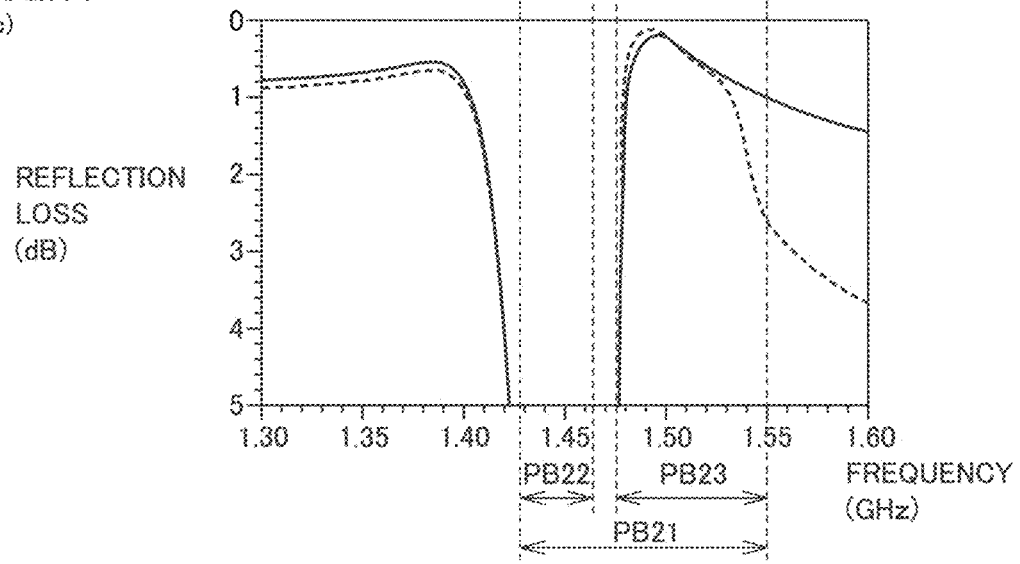
Figure 18:
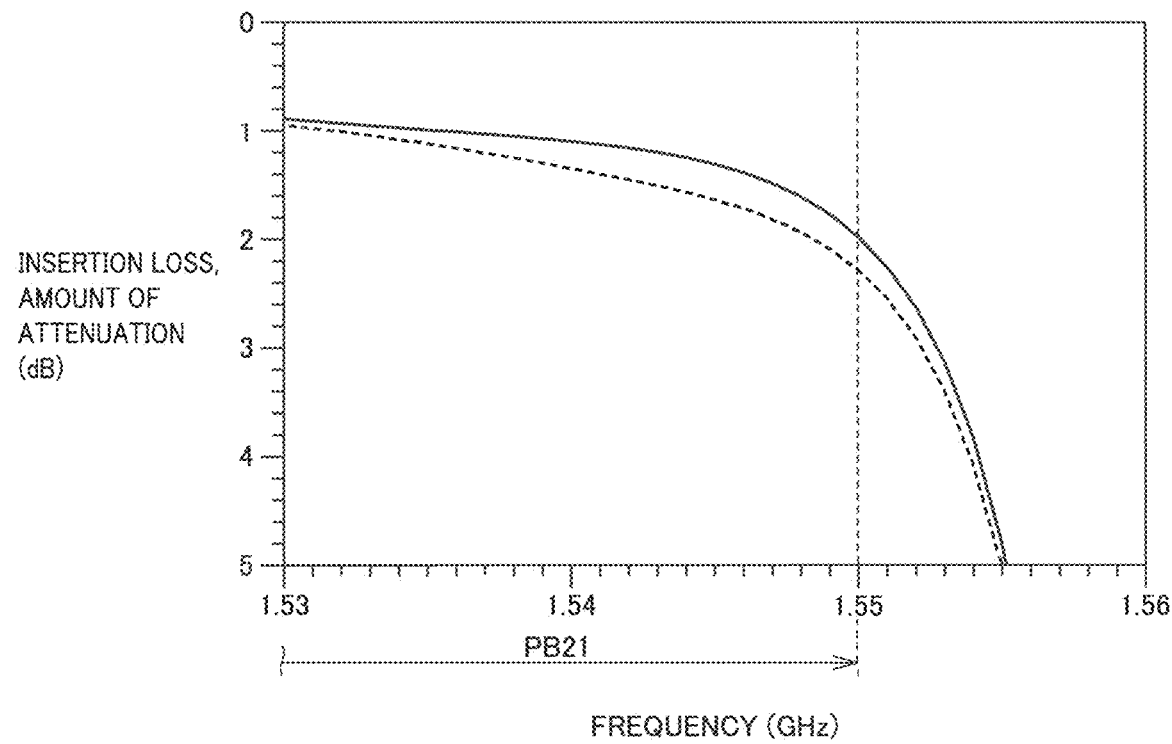
FIG. 18 is a graph that shows the pass characteristics in the range of 1.53 GHz to 1.56 GHz of FIG. 17(a) in an enlarged manner.

FIGS. 17(a), (b), and (c) are graphs that respectively show pass characteristics of the filter devices and reflection characteristics of the low band sided filters according to Embodiments 3 and 4. FIG. 17(a) shows the pass characteristic of filter device 4 in FIG. 16 (solid line) and the pass characteristic of the filter device according to Embodiment 3 (dotted line). FIG. 17(b) shows the reflection characteristic of filter FLT41 in FIG. 16 (solid line) and the reflection characteristic of the low band sided filter in Embodiment 3 (dotted line) when a signal is input from input-output terminal T1. FIG. 17(c) shows the reflection characteristic of filter FLT41 in FIG. 16 (solid line) and the reflection characteristic of the low band sided filter in Embodiment 3 (dotted line) when a signal is input from input-output terminal T2. FIG. 18 shows the pass characteristics in the range of 1.53 GHz to 1.56 GHz in FIG. 17(a).

As shown in FIGS. 17(b) and 17(c), the reflection loss of filter FLT41 is smaller than the reflection loss of the low band sided filter according to Embodiment 3 at the high band edge of passband PB21. As shown in FIG. 18, the insertion loss of filter device 4 is smaller than the insertion loss of the filter device according to Embodiment 3 at the high band edge of passband PB21.

The reflection characteristic of filter FLT41 is improved more than in Embodiment 3 at the high band edge of passband PB21, so that the pass characteristic of filter device 4 is improved more than in Embodiment 3.

Modification of Embodiment 4

It suffices that in the low band sided filter of the filter device according to Embodiment 4, multiple series arm circuits are disposed in series in a path from one input-output terminal via a low band sided filter to the other input-output terminal, and capacitors are connected in parallel with elastic wave resonators included in series arm circuits at the opposite ends of the multiple series arm circuits.

Figure 19:
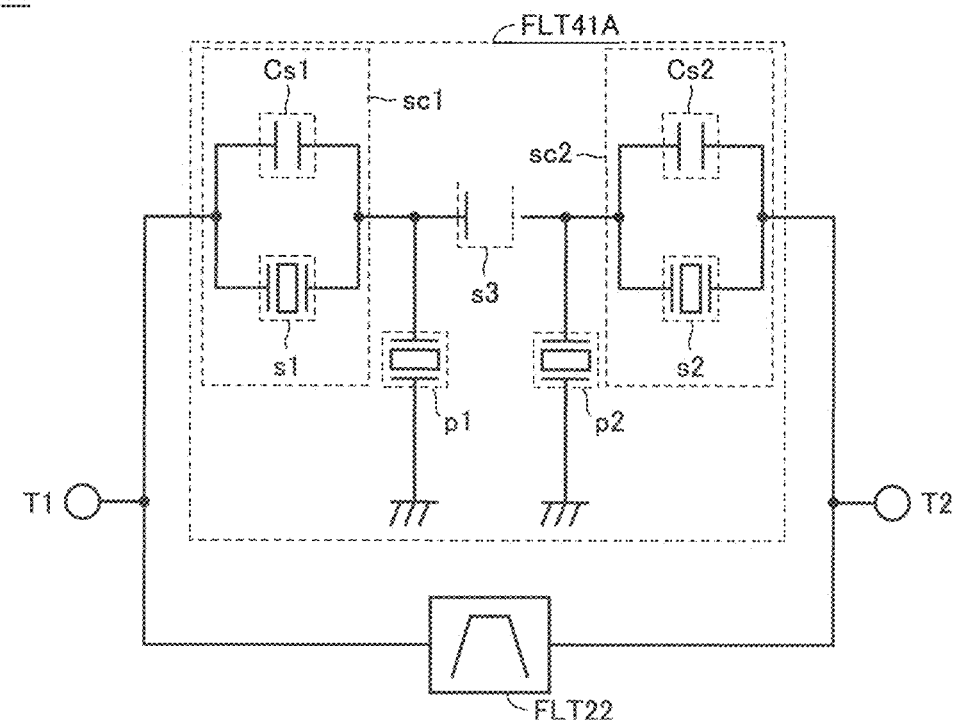
FIG. 19 is a circuit configuration diagram of a filter device according to a modification of Embodiment 4.

FIG. 19 is a circuit configuration diagram of a filter device 4A according to a modification of Embodiment 4. The components of filter device 4A are obtained by replacing filter FLT41 of filter device 4 in FIG. 16 with an FLT41A (first filter). The components of filter FLT41A are obtained by adding a series arm resonator s3 and a parallel arm resonator p2 to the components of filter FLT41. The other components are similar to those of Embodiment 4, description of which will not be repeated.

As shown in FIG. 19, series arm resonator s3 is connected between series arm circuits sc1 and sc2. Parallel arm resonator p2 is connected between a grounding point and a connecting point between series arm resonator s3 and series arm circuit sc2. Series arm circuit sc1, series arm resonator s3, and series arm circuit sc2 are connected in series with each other between input-output terminals T1 and T2 with series arm circuits sc1 and sc2 at opposite ends.

As described above, the filter devices according to Embodiment 4 and the modification can reduce an insertion loss at the high band edge of a passband.

Embodiment 5

Embodiment 5 describes a case where the pass characteristic of a low band sided filter is changed by connecting a switch in series with a capacitor connected in series with an elastic wave resonator included in the low band sided filter and switching the conductive state of the switch.

Figure 20:
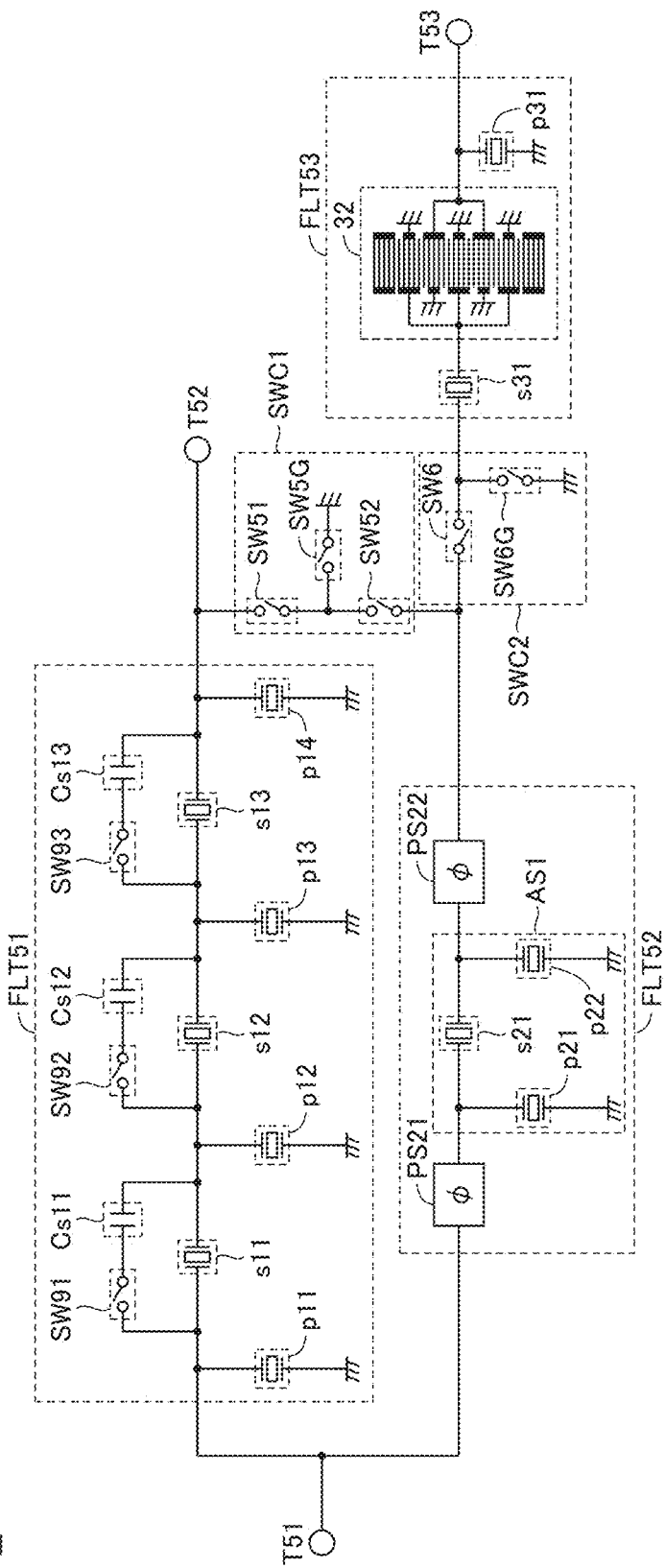
FIG. 20 is a circuit configuration diagram of a filter device according to Embodiment 5.

FIG. 20 is a circuit configuration diagram of a filter device 5 according to Embodiment 5. As shown in FIG. 20, filter device 5 includes a filter FLT51 (first filter), a filter FLT52 (second filter), a filter FLT53, a switch circuit SWC1 (second switch), a switch circuit SWC2 (third switch), a common terminal T51 (first terminal), an input-output terminal T52 (second terminal), and an input-output terminal T53 (third terminal). Filter device 5, filter FLT51, and filter FLT52 have a passband PB51 (first passband), a passband PB52 (second passband), and a passband PB53 (third passband), respectively. Filter FLT51 is a low band sided filter, and filter FLT52 is a high band sided filter. Filter FLT53 has passband PB53.

Passband PB51 includes part of passband PB52 and part of passband PB53. Passband PB52 is narrower than passband PB51. Passband PB53 is narrower than passband PB51. Passband PB53 has a center frequency higher than the center frequency of passband PB52. Passbands PB52 and PB53 do not overlap each other.

Filter FLT52 and switch circuit SWC1 are connected in series with each other in this order between common terminal T51 and input-output terminal T52. Between common terminal T51 and input-output terminal T52, filter FLT51 is connected in parallel with filter FLT52 and switch circuit SWC1 connected in series. Switch circuit SWC2 and filter FLT53 are connected in series with each other in this order between input-output terminal T53 and a connecting point between filter FLT52 and switch circuit SWC1.

Switch circuit SWC1 includes switches SW51, SW52, and SW5G. Switches SW51 and SW52 are connected in series with each other between filter FLT52 and input-output terminal T52. Switches SW51 and SW52 are connected in parallel with filter FLT51. Switch SW5G is connected between a grounding point and a connecting point between switches SW51 and SW52. The conductive states of switches SW51 and SW52 are synchronous with each other. The conductive states of switch SW51 (SW52) and switch SW5G are switched exclusively.

Switch circuit SWC2 includes switches SW6 and SW6G. Filter FLT52, switch SW6, and filter FLT53 are connected in series with each other in this order between common terminal T51 and input-output terminal T53. Switch SW6G is connected between the grounding point and a connecting point between switch SW6 and filter FLT53. The conductive states of switches SW6 and SW6G are switched exclusively.

Filter FLT51 includes a series arm resonator s11 (first elastic wave resonator), a series arm resonator s12, a series arm resonator s13 (second elastic wave resonator), parallel arm resonators p11 to p14, a switch SW91 (first switch), a switch SW92 (first switch), a switch SW93 (first switch), a capacitor Cs11 (first capacitive element), a capacitor Cs12, and a capacitor Cs13 (second capacitive element). Series arm resonators s11 to s13 are connected in series with each other between common terminal T51 and input-output terminal T52. Parallel arm resonator p11 is connected between a grounding point and a connecting point between common terminal T51 and series arm resonator s11. Parallel arm resonator p12 is connected between the grounding point and a connecting point between series arm resonators s11 and s12. Parallel arm resonator p13 is connected between the grounding point and a connecting point between series arm resonators s12 and s13. Parallel arm resonator p14 is connected between the grounding point and a connecting point between series arm resonator s13 and input-output terminal T52.

Switches SW91 to SW93 are connected in series with capacitors Cs11 to Cs13, respectively. Switch SW91 and capacitor Cs11 are connected in parallel with series arm resonator s11. Switch SW92 and capacitor Cs12 are connected in parallel with series arm resonator s12. Switch SW93 and capacitor Cs13 are connected in parallel with series arm resonator s13. The pass characteristic of filter FLT51 differs between the case where switches SW91 to SW93 are ON and the case where switches SW91 to SW93 are OFF.

The conductive states of switches SW51, SW52, and SW5G, switches SW6 and SW6G, and switches SW91 to SW93 are switched in response to, for example, a control signal from a control circuit included in an RFIC (not shown). The control circuit may be provided separately from the RFIC.

Filter FLT52 includes a phase shifter PS21 (first phase shifter), a phase shifter PS22 (second phase shifter), and an elastic wave filter AS1. Elastic wave filter AS1 includes a series arm resonator s21, and parallel arm resonators p21 and p22. Phase shifter PS21 is connected between common terminal T51 and series arm resonator s21. Phase shifter PS22 is connected between series arm resonator s21 and switch SW6. Phase shifters PS21 and PS22 are configured to increase the impedance of filter FLT52 in passband PB52 of filter FLT51.

Filter FLT53 includes a series arm resonator s31, a longitudinally coupled resonator 32, and a parallel arm resonator p31. Series arm resonator s31 and longitudinally coupled resonator 32 are connected in series with each other between switch SW6 and input-output terminal T53. Parallel arm resonator p31 is connected between a grounding point and a connecting point between longitudinally coupled resonator 32 and input-output terminal T53. Longitudinally coupled resonator 32 is formed of, for example, multiple interdigital transducer (IDT) electrodes placed side by side between two reflectors. Longitudinally coupled resonator 32 may include no reflector.

Figure 21:
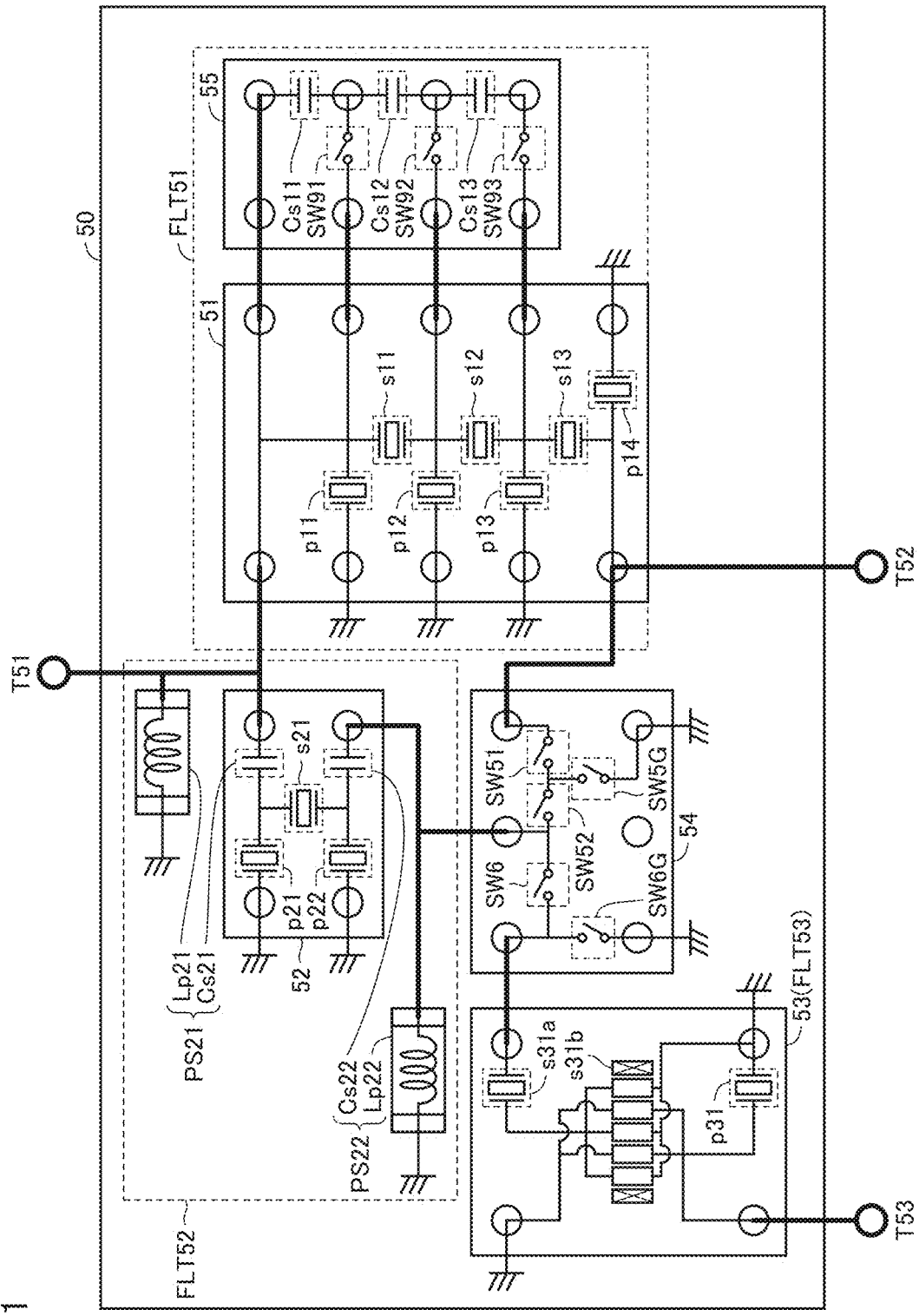
FIG. 21 shows an example module configuration of the filter device in FIG. 20.

FIG. 21 shows an example module configuration of filter device 5 in FIG. 20. As shown in FIG. 21, packages (chips) 51 to 55 and inductors Lp21 and Lp22 are mounted on circuit board 50.

Packages 51 to 53 are packages for resonators. Packages 54 and 55 are packages for switches. Packages 51 to 55 each have, on its bottom surface, surface electrodes for mounting on circuit board 50. The surface electrode is indicated by a circle in FIG. 21. FIG. 21 schematically shows circuit elements and lines configured in each package for ease of interpretation of a package structure, and shows the surface electrodes on the bottom surface of each package through each of packages 51 to 55.

Circuit board 50 has externally connected electrodes individually forming common terminal T51 and input-output terminals T52 and T53. This externally connected electrode is a surface electrode for mounting of circuit board 50 on a mother board or the like, or a connector connecting circuit board 50 with any other electronic component.

Series arm resonators s11 to s13 and parallel arm resonators p11 to p14 are mounted on package 51. Switches SW91 to SW93 and capacitors Cs11 to Cs13 are mounted on package 55. Packages 51 and 55 form filter FLT51.

Series arm resonator s21, parallel arm resonators p21 and p22, and capacitors Cs21 and Cs22 are mounted on package 52. Inductor Lp21 and capacitor Cs21 form phase shifter PS21. Inductor Lp22 and capacitor Cs22 form phase shifter PS22. Package 52 and inductors Lp21 and Lp22 form filter FLT52.

Series arm resonator s31, parallel arm resonator p31, and longitudinally coupled resonator 32 are mounted on package 53. Package 53 forms filter FLT53. Switches SW51, SW52, SW5G, SW6, and SW6G are formed in package 54.

Switches SW51, SW52, SW5G, SW6, and SW6G, switches SW91 to SW93, and capacitors Cs11 to Cs13, Cs21, and Cs22 may be modularized in a configuration different from the above configuration. For example, capacitors Cs11 to Cs13 may be mounted on packages for resonators, not on packages for switches, or may be mounted in circuit board 50.

Figure 22:
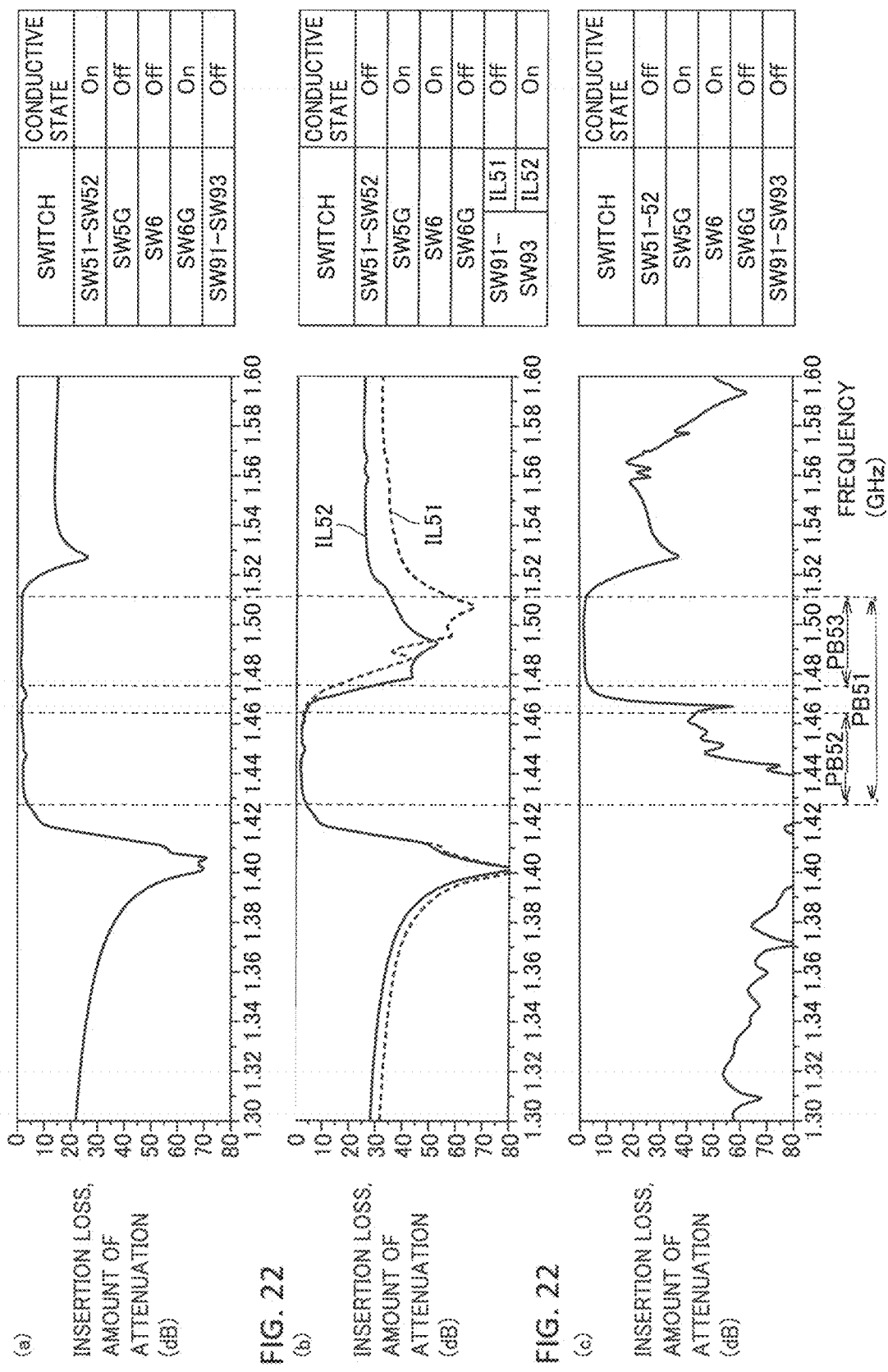
FIG. 22(a), FIG. 22(b), and FIG. 22(c) are respective charts that show pass characteristics of the filter device in FIG. 20 and conductive states of the respective switches.

FIG. 22 is a chart showing pass characteristics of the filter device in FIG. 20 and the conductive states of switches SW51, SW52, SW5G, SW6, SW6G, and SW91 to SW93.

Referring to FIGS. 20 and 22, FIG. 22(a) shows a pass characteristic between common terminal T51 and input-output terminal T52 in the case where switches SW51, SW52, and SW6G are ON and switches SW5G, SW6, and SW91 to SW93 are OFF. The passband between common terminal T51 and input-output terminal T52 with the conductive states of the switches shown in FIG. 22(a) is passband PB51 formed by filters FLT51 and FLT52. In this case, no radio-frequency (RF) signal is input to and output from input-output terminal T53.

FIG. 22(b) is a chart showing a pass characteristic IL51 between common terminal T51 and input-output terminal T52 in the case where switches SW51, SW52, SW6G, and SW91 to SW93 are OFF and switch SW5G and switch SW6 are ON and a pass characteristic IL52 between common terminal T51 and input-output terminal T52 in the case where switches SW51, SW52, and SW6G are OFF and switch SW5G, and switch SW6 and SW91 to SW93 are ON. The passband between common terminal T51 and input-output terminal T52 with the conductive states of the switches shown in FIG. 22(b) is passband PB52 formed by filter FLT51.

FIG. 22(c) shows a pass characteristic between common terminal T51 and input-output terminal T53 in the case where switches SW51, SW52, SW6G, and SW91 to SW93 are OFF and switches SW5G and SW6 are ON. The passband between common terminal T51 and input-output terminal T53 with the conductive states of the switches shown in FIG. 22(c) is passband PB53 formed by filter FLT52. A similar pass characteristic is obtained even when SW91 to SW93 are ON.

Referring to FIG. 22(b), pass characteristics IL51 and IL52 change in passband PB52 in substantially the same manner. At frequencies higher than passband PB52, an attenuation pole occurs at frequencies at which pass characteristic IL52 is lower than pass characteristic IL51. Consequently, at the frequency band between passband PB52 and passband PB53, pass characteristic IL52 increases more steeply than pass characteristic IL51 does. At passband PB53, pass characteristics IL51 and IL52 change in different manners. Filter device 5 can change the pass characteristic of filter FLT51 by switching the conductive states of switches SW91 to SW93.

Filter device 5 can reduce an insertion loss at a high band edge of passband PB51 with the conductive states of the switches shown in FIG. 22(a). Also, filter device 5 can switch between the bandpass filter configuration with passband PB51 (the conductive states of the switches in FIG. 22(a)) and the multiplexer configuration with passband PB52 and passband PB53 (the conductive states of the switches shown in FIG. 22(b) and FIG. 22(c)). As illustrated, in a frequency band between passband PB52 and passband PB53, an insertion loss of the filter device 5 is smaller than an insertion loss of either filter in the frequency band between passband PB52 and passband PB53. Also as illustrated, the passband of the filter device 5 contains no discontinuities.

As described above, the filter device according to Embodiment 5 can reduce an insertion loss at the high band edge of a passband.

Embodiment 6

Embodiment 6 describes a RF front-end circuit and a communication apparatus that can be implemented using the filter device described in each of Embodiments 1 to 5.

Figure 23:
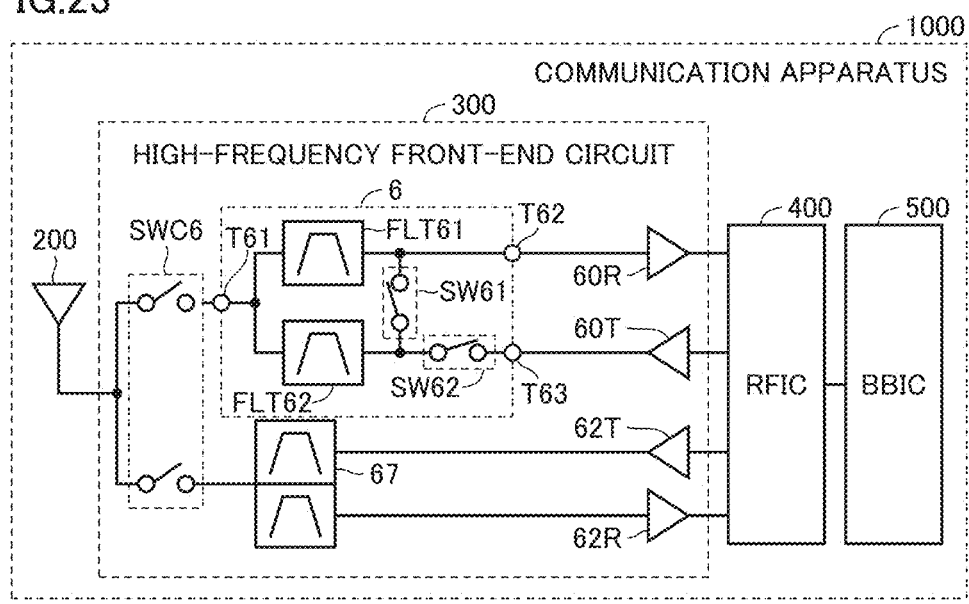
FIG. 23 is a configuration diagram of a communication apparatus according to Embodiment 6.

FIG. 23 is a configuration diagram of a communication apparatus 1000 according to Embodiment 6. As shown in FIG. 23, communication apparatus 1000 includes a RF front-end circuit 300, an RFIC 400, a baseband integrated circuit (BBIC) 500, and an antenna element 200.

RF front-end circuit 300 includes a filter device 6, a switch circuit SWC6, a duplexer 67, transmission amplifier circuits 60T and 62T, and reception amplifier circuits 60R and 62R.

Switch circuit SWC6 is connected to antenna element 200, filter device 6, and duplexer 67. Switch circuit SWC6 switches between the connection between antenna element 200 and filter device 6 and the connection between antenna element 200 and duplexer 67.

Filter device 6 includes a filter FLT61 (first filter), a filter FLT62 (second filter), a common terminal T61 (first terminal), an input-output terminal T62 (second terminal), an input-output terminal T63 (third terminal), a switch SW61 (second switch), and a switch SW62 (third switch). The passbands of filter device 6, filter FLT61, and filter FLT62 are a passband PB61 (first passband), a passband PB62 (second passband), and a passband PB63 (third passband), respectively. Filter FLT61 is a low band sided filter, and filter FLT62 is a high band sided filter.

Passband PB61 includes part of passband PB62 and part of passband PB63. Passband PB62 is narrower than passband PB61. Passband PB63 is narrower than passband PB61. Passband PB63 has a center frequency higher than the center frequency of passband PB62. Passbands PB62 and PB63 do not overlap each other.

Filter FLT62 and switch SW61 are connected in series with each other in this order between common terminal T61 and input-output terminal T62. Between common terminal T61 and input-output terminal T62, filter FLT61 is connected in parallel with filter FLT62 and switch SW61 connected in series. Switch SW62 is connected between input-output terminal T63 and a connecting point between filter FLT62 and switch SW61.

Filter device 6 can be implemented by adding switches SW61 and SW62 and input-output terminal T63 to the filter device according to each of Embodiments 1 to 4. Filter device 6 can also be implemented as the filter device according to Embodiment 5.

Common terminal T61 is connected to switch circuit SWC6. Input-output terminal T62 is connected to reception amplifier circuit 60R. Input-output terminal T63 is connected to transmission amplifier circuit 60T.

Transmission amplifier circuit 60T is a power amplifier that amplifies the power of a radio-frequency signal in a predetermined frequency band. Reception amplifier circuit 60R is a low-noise amplifier that amplifies the power of a radio-frequency signal in a predetermined frequency band.

Duplexer 67 has a transmission terminal and a reception terminal. Duplexer 67 has frequency bands different from passbands PB61 to PB63 as a transmission band and a reception band.

Transmission amplifier circuit 62T is connected to the transmission terminal of duplexer 67. Transmission amplifier circuit 62T is a power amplifier that amplifies the power of a RF transmission signal in a predetermined frequency band. Reception amplifier circuit 62R is connected to the reception terminal of duplexer 67. Reception amplifier circuit 62R is a low-noise amplifier that amplifies the power of a RF signal in a predetermined frequency band.

RFIC 400 processes RF signals transmitted and received by antenna element 200. Specifically, RFIC 400 processes a RF signal input from antenna element 200 through a receiving-side signal path thereto by down conversion or the like and outputs the signal to BBIC 500. RFIC 400 processes a transmission signal input from BBIC 500 by up conversion or the like and outputs the signal.

RFIC 400 outputs a control signal for switching the conductive state to each of switch circuit SWC6 and switches SW61 and SW62. This control signal may be output from a control circuit provided separately from the RFIC.

Modification of Embodiment 6

Figure 24:
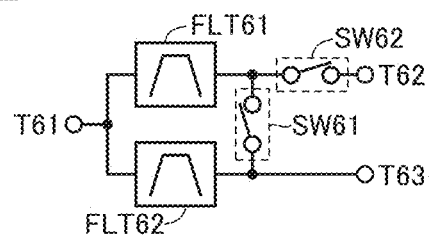
FIG. 24 is a circuit configuration diagram of a filter device according to a modification of Embodiment 6.

The case where the third switch is connected between the third input-output terminal and the connecting point between the second filter and the second switch has been described for filter device 6. In the filter device according to Embodiment 6, switch SW62 (third switch) may be connected between input-output terminal T62 (second terminal) and a connecting point between low band sided filter FLT61 (first filter) and switch SW61 (second switch), as in a filter device 6A according to a modification of Embodiment 6 shown in FIG. 24.

As described above, the communication apparatuses according to Embodiment 6 and the modification can improve communication quality by a filter device which has a reduced insertion loss at a high band edge.

[Relation Between Capacity Density of Elastic Wave Resonator and Capacity Density of Capacitive Element]

The following will provide a supplementary description of the relation between a capacity density of an elastic wave resonator connected in parallel with a capacitive element and a capacity density of the capacitive element in the low band sided filter according to each of Embodiments 1 to 6. The capacity density refers to a capacitance per unit area.

The capacitive element can be achieved by, for example, forming interdigitated electrodes on the surface of a dielectric or by forming two opposing electrodes with a dielectric therebetween. In this case, the capacitance per unit area of the capacitive element increases by making the dielectric constant of the dielectric higher than the dielectric constant of the elastic wave resonator or decreasing the interval between the opposing electrodes. Consequently, the filter device can be miniaturized.

When a piezoelectric material is used for the dielectric, a bulk wave occurs also in the capacitive element. Thus, the capacity density of the capacitive element needs to be greater than the capacity density of the elastic wave resonator such that no bulk wave occurs in the capacitive element at a frequency at which a bulk wave occurs in the elastic wave resonator connected in parallel with the capacitive element, thereby making the self-resonant frequency of the capacitive element higher than the antiresonance frequency of the elastic wave resonator.

For example, it is assumed that when a SAW resonator is used as an elastic wave resonator, the elastic wave resonator has an IDT electrode composed of multiple electrode fingers formed on a piezoelectric substrate. It is assumed that a capacitive element connected in parallel with the elastic wave resonator has an interdigital capacitor electrode composed of multiple electrode fingers formed on the substrate. The frequency at which the capacitive element has a maximum impedance is designed to be in the frequency band higher than the first passband of the filter device according to the embodiment. In such a case, the capacity density of the capacitive element can be made higher than the capacity density of the elastic wave resonator by making a repetition pitch of the electrode fingers (electrode finger pitch) in the interdigital capacitor electrode smaller than the electrode finger pitch of the IDT electrode.

Since the pitch of the electrode fingers in the interdigital capacitor electrode can be decreased further by making the film thickness of the electrode finger in the interdigital capacitor electrode smaller than the film thickness of the electrode finger of the IDT electrode, the capacity density of the capacitive element can be increased further. The capacity density of the capacitive element can be increased further by making the ratio (electrode finger duty ratio) at which multiple electrode fingers account for with respect to the pitch of the multiple electrode fingers in the interdigital capacitor electrode greater than the electrode finger duty ratio of the IDT electrode.

For example, it is assumed that when a BAW resonator is used as an elastic wave resonator, the elastic wave resonator has a first electrode and a second electrode opposed to the first electrode with a piezoelectric body therebetween. It is assumed that the capacitive element has a third electrode and a fourth electrode opposed to the third electrode with a dielectric therebetween. In such a case, the capacity density of the capacitive element can be made higher than the capacity density of the elastic wave resonator by making the film thickness of the dielectric of the capacitive element smaller than the film thickness of the piezoelectric body of the elastic wave resonator. Alternatively, the capacity density of the capacitive element can be made higher than the capacity density of the elastic wave resonator by making the dielectric constant of the dielectric of the capacitive element higher than the dielectric constant of the piezoelectric body of the elastic wave resonator.

The presently disclosed embodiments are also expected to be combined and implemented as appropriate within a consistent range. The presently disclosed embodiments should be considered in all aspects as illustrative and not restrictive. The scope of the present disclosure is defined by the appended claims, rather than by the description above. All changes which come within the meaning and range of equivalency of the appended claims are to be embraced within their scope.

REFERENCE SIGNS LIST 1, 1A, 2, 4, 4A, 5, 6, 6A, 900: filter device; 32: longitudinally coupled resonator; 50: circuit board; 51-55 package; 60R, 62R: reception amplifier circuit; 60T, 62T: transmission amplifier circuit, 67: duplexer; 200: antenna element; 300: radio-frequency front-end circuit; 1000: communication apparatus; AS1: elastic wave filter; Cp1, Cs1, Cs2, Cs11, Cs12, Cs13, Cs21, Cs22: capacitor; FLT1, FLT2, FLT21, FLT22, FLT41, FLT41A, FLT51-FLT53, FLT61, FLT62, FLT91, FLT92: filter; Lp21, Lp22: inductor; PS1, PS2, PS21, PS22: phase shifter; SW1-SW4, SW5G, SW6, SW6G, SW51, SW52, SW61, SW62, SW91-SW93: switch; SWC1, SWC2, SWC6: switch circuit; T1, T2, T52, T53, T62, T63: input-output terminal; T51, T61: common terminal; p1a, p1, p2, p11-p14, p21, p22, p31: parallel arm resonator; pc1: parallel arm circuit; s1a, s1-s3, s2a, s11-s13, s21, s31: series arm resonator; sc1, sc2: series arm circuit.

The invention claimed is:

1. A filter device having a passband, the filter device comprising:

a first filter and a second filter connected in parallel with each other between a first terminal and a second terminal,
wherein the first and second filters are configured so that:
the passband of the filter device includes at least part of a first passband of the first filter and at least part of a second passband of the second filter,
the first passband and the second passband are both narrower than the passband of the filter device, and
the second passband has a center frequency higher than a center frequency of the first passband,
wherein the first filter includes:
a plurality of elastic wave resonators, and
a first capacitive element connected in parallel with a first elastic wave resonator included in the plurality of elastic wave resonators, and
wherein the first and second filters are further configured so that:
the first passband and the second passband do not overlap each other,
the passband of the filter device is continuous,
an insertion loss of the filter device in the passband of the filter device falls within a range from a minimum value of the insertion loss to a value obtained by adding 3 dB to the minimum value, and
in a frequency band between the first passband and the second passband, the insertion loss of the filter device is smaller than an insertion loss of each of the first filter and the second filter.

2. The filter device according to claim 1, wherein
the first filter includes a parallel arm circuit connected between a grounding node and a path from the first terminal via the first filter to the second terminal, and
the parallel arm circuit includes the first elastic wave resonator and the first capacitive element.

3. The filter device according to claim 1, wherein
the first filter includes at least one series arm circuit disposed in a path from the first terminal via the first filter to the second terminal, and
the at least one series arm circuit includes the first elastic wave resonator and the first capacitive element.

4. The filter device according to claim 3, wherein
the at least one series arm circuit includes a first series arm circuit and a second series arm circuit,
the first series arm circuit includes the first elastic wave resonator and the first capacitive element,
the second series arm circuit includes a second elastic wave resonator and a second capacitive element connected in parallel with the second elastic wave resonator, and
the at least one series arm circuit is disposed in series, in the path from the first terminal via the first filter to the second terminal, with the first series arm circuit and the second series arm circuit at opposite ends.

5. The filter device according to claim 1, wherein
the plurality of elastic wave resonators include another elastic wave resonator that is not connected in parallel with a capacitive element, and
under a condition of a value obtained by dividing a difference between an antiresonance frequency of an elastic wave resonator and a resonance frequency of the elastic wave resonator by the resonance frequency is defined as a fractional bandwidth, a fractional bandwidth of the first elastic wave resonator is larger than a fractional bandwidth of the another elastic wave resonator.

6. The filter device according to claim 1, wherein under a condition a capacitance value per unit area is defined as a capacity density, a capacity density of the first capacitive element is higher than a capacity density of the first elastic wave resonator.

7. The filter device according to claim 1, wherein
the first filter further includes a first switch connected in series with the first capacitive element, and
the first elastic wave resonator is connected in parallel with the first capacitive element.

8. The filter device according to claim 1, wherein
the second filter includes
an elastic wave filter,
a first phase shifter disposed in a path between the elastic wave filter and the first terminal, and
a second phase shifter disposed in a path between the elastic wave filter and the second terminal, and
the first phase shifter and the second phase shifter are configured to increase an impedance of the second filter in the first passband.

9. The filter device according to claim 1, further comprising a first switch, a second switch, a third switch, and a fourth switch, wherein
the first switch, the first filter, and the second switch are connected in series in this order between the first terminal and the second terminal,
the third switch, the second filter, and the fourth switch are connected in series in this order between the first terminal and the second terminal, and
between the first terminal and the second terminal, the first switch, the first filter, and the second switch which are connected in series are connected in parallel with the third switch, the second filter, and the fourth switch which are connected in series.

10. The filter device according to claim 1, further comprising:
a first switch and a second switch, wherein
the second filter and the first switch are connected in series in this order between the first terminal and the second terminal,
between the first terminal and the second terminal, the first filter is connected in parallel with the second filter and the first switch which are connected in series, and
the second switch is connected between a third terminal and a node that connects the second filter and the first switch.

11. The filter device according to claim 1, further comprising:
a first switch and a second switch, wherein
the first filter and the first switch are connected in series in this order between the first terminal and a third terminal,
between the first terminal and the third terminal, the second filter is connected in parallel with the first filter and the first switch which are connected in series, and
the second switch is connected between the second terminal and a node between the first filter and the first switch.

12. A radio-frequency (RF) front-end circuit comprising:
an amplifier circuit; and
a filter device, the filter device including
a first filter and a second filter connected in parallel with each other between a first terminal and a second terminal,
wherein the first and second filters are configured so that:

a passband of the filter device includes at least part of a first passband of the first filter and at least part of a second passband of the second filter, the first passband and the second passband are both narrower than the passband of the filter device, and the second passband has a center frequency higher than a center frequency of the first passband, wherein the first filter includes:

a plurality of elastic wave resonators, and a first capacitive element connected in parallel with a first elastic wave resonator included in the plurality of elastic wave resonators, and wherein the first and second filters are further configured so that:

the first passband and the second passband do not overlap each other, the passband of the filter device is continuous, and an insertion loss of the filter device in the passband of the filter device falls within a range from a minimum value of the insertion loss to a value obtained by adding 3 dB to the minimum value, and in a frequency band between the first passband and the second passband, the insertion loss of the filter device is smaller than an insertion loss of each of the first filter and the second filter; and wherein the amplifier circuit is electrically connected to the filter device.

13. The RF front-end circuit according to claim 12, wherein the first filter includes a parallel arm circuit connected between a grounding node and a path from the first terminal via the first filter to the second terminal, and the parallel arm circuit includes the first elastic wave resonator and the first capacitive element.

14. The RF front-end circuit according to claim 12, wherein the first filter includes at least one series arm circuit disposed in a path from the first terminal via the first filter to the second terminal, and the at least one series arm circuit includes the first elastic wave resonator and the first capacitive element.

15. The RF front-end circuit according to claim 12, wherein the plurality of elastic wave resonators include another elastic wave resonator that is not connected in parallel with a capacitive element, and under a condition of a value obtained by dividing a difference between an antiresonance frequency of an elastic wave resonator and a resonance frequency of the elastic wave resonator by the resonance frequency is defined as a fractional bandwidth, a fractional bandwidth of the first elastic wave resonator is larger than a fractional bandwidth of the another elastic wave resonator.

16. The radio-frequency (RF) front-end circuit according to claim 12, wherein the filter device further includes a first switch and a second switch, the second filter and the first switch are connected in series in this order between the first terminal and the second terminal, between the first terminal and the second terminal, the first filter is connected in parallel with the second filter and the first switch which are connected in series, and the second switch is connected between a third terminal and a node that connects the second filter and the first switch.

17. The radio-frequency (RF) front-end circuit according to claim 12, wherein the filter device further includes a first switch and a second switch, the first filter and the first switch are connected in series in this order between the first terminal and a third terminal, between the first terminal and the third terminal, the second filter is connected in parallel with the first filter and the first switch which are connected in series, and the second switch is connected between the second terminal and a node between the first filter and the first switch.

* * * * *